(12) United States Patent
Kobayashi

(10) Patent No.: US 7,544,897 B2
(45) Date of Patent: Jun. 9, 2009

(54) CONNECTING SUBSTRATE, CONNECTING STRUCTURE. CONNECTION METHOD AND ELECTRONIC APPARATUS

(75) Inventor: Tomonaga Kobayashi, Chino (JP)

(73) Assignee: Seiko Epson Corporation (JP)

( * ) Notice: Subject to any disclaimer, the term of this patent is extended or adjusted under 35 U.S.C. 154(b) by 283 days.

(21) Appl. No.: 11/194,391

(22) Filed: Aug. 1, 2005

(65) Prior Publication Data
US 2006/0027909 A1 Feb. 9, 2006

(30) Foreign Application Priority Data
Aug. 5, 2004 (JP) ............... 2004-228995
May 30, 2005 (JP) ............... 2005-157057

(51) Int. Cl.
*H05K 1/00* (2006.01)
(52) U.S. Cl. ............... 174/254; 174/262; 174/260; 361/789
(58) Field of Classification Search ............... 174/254, 174/260, 262; 361/760, 681, 789; 439/65, 439/74; 349/149, 150
See application file for complete search history.

(56) References Cited

U.S. PATENT DOCUMENTS

| | | | |
|---|---|---|---|
| 4,431,270 A | * | 2/1984 | Funada et al. ............... 349/149 |
| 5,808,529 A | | 9/1998 | Hamre |
| 7,012,667 B2 | * | 3/2006 | Pai ............... 349/152 |
| 2002/0017397 A1 | * | 2/2002 | Ramey et al. ............... 174/255 |

FOREIGN PATENT DOCUMENTS

| | | | |
|---|---|---|---|
| JP | 02-52496 | | 2/1990 |
| JP | 2005-157057 | | 2/1990 |
| JP | 02052496 | * | 2/1990 |
| JP | 05-006918 | | 1/1993 |
| JP | 06-053703 | | 2/1994 |
| JP | 06-325836 | | 11/1994 |
| JP | 11-088001 | | 3/1999 |
| JP | 2001-502127 | | 2/2001 |
| JP | 2003-017908 | | 1/2003 |
| JP | 2005-079762 | | 3/2005 |

* cited by examiner

*Primary Examiner*—Jeremy C Norris
*Assistant Examiner*—Yuriy Semenenko
(74) *Attorney, Agent, or Firm*—Harness, Dickey & Pierce, P.L.C.

(57) ABSTRACT

A connecting substrate includes a first conductive member; an insulating layer; and a second conductive member, the first conductive member and the second conductive member facing each other via the insulating layer, in which wherein an end portion of either one of the first conductive member and the second conductive member extends past an end portion of the other conductive member and past an end portion of the insulating layer.

11 Claims, 12 Drawing Sheets

CONNECTING SUBSTRATE, CONNECTING STRUCTURE. CONNECTION METHOD AND ELECTRONIC APPARATUS

BACKGROUND OF THE INVENTION

1. Field of the Invention

The present invention relates to a connecting substrate, a connecting structure, a connection method, and an electronic apparatus.

Priority is claimed on Japanese Patent Application No. 2004-228995, filed Aug. 5, 2004, and Japanese Patent Application No. 2005-157057, filed May 30, 2005 the contents of which are incorporated herein by reference.

2. Description of Related Art

Conventionally, when connecting a flexible substrate to a liquid crystal panel, a method is employed in which signals from a drive IC or the like that is mounted on the flexible substrate are transmitted to the liquid crystal panel side by electrically connecting wiring that is formed on the flexible substrate to electrode terminals that are formed at positions on the liquid crystal panel that correspond to the wiring on the flexible substrate.

In recent years, there has been a tendency for the operating frequencies of electronic apparatuses such as liquid crystal display devices and the like to be moved to higher frequencies due to increasing volumes of information, improvements in processing speed, and the like, and there is an increasing demand to transmit a large volume of signals at high speed. In such a situation, in the above-described method to connect wires formed on a flexible substrate to electrode terminals formed on a liquid crystal panel, mismatching in the characteristic impedance from inductor components or the like is generated in the wires on the flexible substrate by this movement of transmitted signals to higher frequencies. As a result, a problem has arisen in that the transmitted signals are degraded.

Therefore, as techniques for this type of high frequency signal transmission, microstriplines and striplines are widely used. Microstriplines are obtained, for example, by forming signal lines on an active surface of a circuit substrate, and by forming solidly formed ground wires to face the signal lines via an insulating layer. Microstriplines are structured such that they can be set to have the desired impedance characteristics. Moreover, striplines are structured, for example, by forming signal lines in an internal layer of the circuit substrate, and by sandwiching the signal lines between solidly formed ground wires. Striplines are also structured such that they can be set to have the desired impedance characteristics.

An example of this type of connecting structure that uses striplines is the structure disclosed, for example, in Japanese Unexamined Patent Application, First Publication No. H06-325836 in which a cut portion is provided by exposing a signal line at a terminal portion of a stripline, and this exposed signal line is then placed in contact with the desired substrate, so as to thereby connect the stripline to the substrate.

However, in the connecting structure disclosed in Unexamined Patent Application, First Publication No. H06-325836, the signal lines that constitute the striplines are connected to the active surface of the substrate being connected, and the ground wires are connected to the rear surface of the substrate being connected. As a result, in the connecting process, it is necessary to handle the two surfaces of the substrate in order to connect the striplines. Furthermore, when connecting the striplines to the substrate, these connections must be made after the positions of each of the stripline signal lines and the electrode terminals formed on the surface of the substrate have been matched, and after the positions of each of the ground wires and the electrode terminals formed on the rear surface of the substrate have been matched. In this manner, in the connecting structure disclosed in Unexamined Patent Application, First Publication No. H06-325836, a problem arises in that the connecting process is made more complex. In addition, in a connecting structure such as that described in Unexamined Patent Application, First Publication No. H06-325836, no consideration is given to cases in which signal lines that are formed in different internal layers of a substrate or on a front or rear of a substrate, such as microstriplines or striplines, are connected to solidly formed ground wires. Consequently, if the signal speed is increased even more in the future, it is probable that the inductor component of the wires will cause problems.

SUMMARY OF THE INVENTION

The present invention was conceived in view of the above circumstances and it is an object thereof to provide a connecting substrate, a connecting structure, an electro-optical device, and an electronic apparatus that enable a connection process to connect impedance control wires of microstriplines, stacked pair lines, and striplines and the like to a substrate that is being connected to be simplified, and that also enable high-speed, high-quality signals to be transmitted.

In order to solve the above-described problems, the present invention provides a connecting substrate including: a first conductive member; an insulating layer; and a second conductive member, the first conductive member and the second conductive member facing each other via the insulating layer, wherein an end portion of either one of the first conductive member and the second conductive member extends past an end portion of the other conductive member and past an end portion of the insulating layer.

The connecting substrate of the present invention is a transmission medium that has what is known as a microstripline structure in which a first conductive member, a second conductive member, and an insulating layer that is sandwiched by these conductive members are provided. In addition, either one of the first conductive member and the second conductive member functions as a conductive member that sets the reference potential.

In the present invention, what is known as a microstripline is used as a connecting device to connect a first substrate to a second substrate. Accordingly, by adjusting the thickness and width of either one of the first conductive member and the second conductive member of the microstripline as well as the thickness of the insulating layer, it is possible to control characteristic impedance that is generated in the first conductive member or the second conductive member. Furthermore, either one of the first conductive member and the second conductive member of the microstripline is formed so as to extend beyond the other conductive member and beyond the insulating layer. Accordingly, when connecting the first substrate to the second substrate, it is possible on the active surface of the first substrate to match the characteristic impedance as far as the signal line connection portion from among the first conductive member and the second conductive member of the microstripline. As a result, it is possible to suppress any degradation of the signal waveform, and it becomes possible to transmit a higher quality signal at a faster speed.

Furthermore, the present invention provides a connecting substrate including: a substrate; a first conductive member; and a second conductive member, the first conductive member and the second conductive member facing each other via the substrate, wherein an end portion of either one of the first conductive member and the second conductive member extends past an end portion of the other conductive member and past an end portion of the substrate.

In the present invention, the aforementioned microstripline is used as a connecting device to connect a first substrate to a second substrate. Accordingly, by adjusting the thickness and width of either one of the first conductive member and the second conductive member of the microstripline as well as the thickness of the insulating layer, it is possible to control characteristic impedance that is generated in the first conductive member or the second conductive member. As a result, it is possible to suppress any degradation of the signal waveform, and it becomes possible to transmit a higher quality signal at a faster speed.

In the present invention, either one of the first conductive member and the second conductive member may be solidly formed on the substrate.

According to this type of structure, because either one of the first conductive member and the second conductive member is solidly formed on the substrate, it does not need to be formed, for example, in a striped pattern, so that the manufacturing process can be shortened.

Moreover, the present invention provides a connecting substrate including: a signal line; an insulating material; and a ground wire, the signal line and ground wire facing each other via the insulating material, wherein end portions of the ground wires extend past end portions end portions of the signal lines and end portions of the insulating material.

Because end portions of the ground wires are provided so as to extend beyond end portions of the signal lines, it is possible to match the characteristic impedance that is caused by condenser components or inductor components in the signal line as far as the extended end portion of the ground wire. Accordingly, it is possible to suppress any degradation of the signal waveform that is generated by these inductor components and the like. As a result, it becomes possible to transmit a higher quality signal at a faster speed, and it is possible to achieve more accuracy as well as an improvement in the signal response. This results in an improvement in display quality being achieved.

The present invention also provides a connecting structure including: a first substrate; a second substrate; a first conductive member that is provided on a first surface of the second substrate; a second conductive member that is provided on a second surface of the second substrate so as to extend past an end portion of the first conductive member and past an end portion of the second substrate; a first convex portion that is provided on an active surface of the first substrate or on the first conductive member or the second conductive member of the second substrate; and a second convex portion that is provided at a greater height than the first convex portion, wherein the first conductive member and the first convex portion are connected together and the second conductive member and the second convex portion are connected together.

The second conductive member that is provided on the second substrate is provided so as to extend beyond the first conductive member, and the second convex portion that is provided on a conductive member of the first substrate or the second substrate is provided at a greater height than the first convex portion. Because of this, both the first conductive member and the second conductive member can be connected simultaneously to the active surface of the first substrate. As a result, in the connection process, the connection to the first substrate can be achieved by handling only one surface of the second substrate. Moreover, because the second substrate is connected to one surface of the first substrate, the positioning when the first and second conductive members are connected to each of the first and second convex portions of the first substrate is easier than when connections are made to the two surfaces of the first substrate. Furthermore, the second conductive member of the second substrate is formed so as to extend beyond the first conductive member and the insulating layer. Accordingly, when connecting the first substrate and the second substrate together, it is possible on the active surface of the first substrate to match the characteristic impedance as far as the extended end portion of the second conductive member of the microstripline. As a result, it is possible to suppress any degradation of the signal waveform, and it becomes possible to transmit a higher quality signal at a faster speed.

In the present invention, a height of the first connecting portion and a height of the second connecting portion may be substantially equal.

According to this type of structure, the first convex portion and the second convex portion can be formed in the same process. Accordingly, because the manufacturing process can be simplified, the manufacturing time can be shortened, and manufacturing costs can be kept low.

The present invention also provides a connecting structure including: a first substrate, a second substrate; a first conductive member that is provided on a first surface of the second substrate; a second conductive member that is provided on a second surface of the second substrate; and a first convex portion and a second convex portion that are provided on an active surface of the first substrate or on the first conductive member or the second conductive member of the second substrate, wherein the first conductive member and the first convex portion are connected together and the second conductive member and the second convex portion are electrically connected together via a conductive body that fills a penetration hole that extends in the thickness direction of the second substrate.

According to this type of structure, because it is not necessary to form either one of the first conductive member and the second conductive member of the second substrate in an extended form, the manufacturing process is simplified. Moreover, because the second conductive member and the second convex portion are connected together via a conductive body that fills a penetration hole that extends in the thickness direction of the second substrate, both the first conductive member and the second conductive member can be connected to the first substrate simultaneously. As a result, in the connection process, the connection to the first substrate can be achieved by handling only one surface of the second substrate. Moreover, because the second conductive member of the second substrate extends beyond the first conductive member, it is possible to match the characteristic impedance that is caused by condenser components or inductor components as far as the end portion of the second conductive member of the second substrate. Accordingly, predetermined signals that are supplied from the second substrate side can be protected from any degradation of the signal waveform that is generated by mismatching in the characteristic impedance. As a result, it becomes possible to transmit a higher quality signal at a faster speed, and it is possible to achieve more accuracy as well as a greater brightness. This results in an improvement in display quality being achieved.

Moreover, in the present invention, the connecting structure may further include a third conductive member that is provided on first surface of the first substrate; and a fourth conductive member that is provided on a second surface of the first substrate, fourth conductive member extending past an end portion of the first conductive member and past an end portion of the first substrate, wherein the third conductive member is connected to the first conductive member that is provided on the second substrate, and the fourth conductive member is connected to the second conductive member that is provided on the second substrate.

According to this type of structure, both of the wires that connect the first substrate and the second substrate can be provided with what is known as a microstripline structure. Because of this, it is possible to match characteristic impedance that is caused by condenser components and inductor components in the third conductive member and fourth conductive member of the first substrate and in the first conductive member and second conductive member of the second substrate as far as an electronic component to which the third and fourth conductive members of the first substrate are connected. Accordingly, compared with when wiring having a microstripline structure is only used on the second substrate side, it becomes possible to transmit a higher quality signal at a faster speed, and an electro-optical device having an improved display quality can be provided.

In the present invention, a plurality of the connecting substrates may be stacked on the first substrate.

According to this type of structure, even if a plurality of the above-described connecting substrates (i.e., the microstriplines) are stacked, either one of the first conductive member or second conductive member of the microstripline is formed so as to extend beyond the other conductive member and beyond the insulating layer. Accordingly, it is possible to match characteristic impedance as far as an end portion of the extended conductive member. As a result, it is possible to suppress any degradation of the signal waveform, and it becomes possible to transmit a higher quality signal at a faster speed.

In addition, the present invention provides a connection method including: providing a first substrate and a second substrate; providing a first conductive member on a first surface of the second substrate; providing, on a second surface of the second substrate, a second conductive member that extends past end portions of the first conductive member and the second substrate; providing a first convex portion on an active surface of the first substrate or on the first conductive member or the second conductive member of the second substrate, and providing a second convex portion at a greater height than the first convex portion; and connecting the first conductive member and the first convex portion together, and connecting the second conductive member and the second convex portion together.

According to this type of connection method, it is possible in the connection process to connect the second substrate to the first substrate by handling only one surface of the second substrate. Moreover, because the second substrate is connected to one surface of the first substrate, positioning is easier when making the connection compared to when the second substrate is connected to the two surfaces of the first substrate. Furthermore, it is possible to match the characteristic impedance that is caused by the condenser component and the inductor component in the first or second conductive members as far as the end portion of the first or second conductive member of the second substrate that is provided in an extended form on the first substrate. Accordingly, predetermined signals that are supplied from the second substrate side can be protected from any degradation of the signal waveform that is generated by mismatching in the characteristic impedance. As a result, it becomes possible to transmit a higher quality signal at a faster speed, and it is possible to achieve more accuracy as well as a greater brightness. This results in an improvement in display quality being achieved The present invention also provides an electro-optical device including the above-described connecting structure. In addition, the present invention provides an electronic apparatus including the above electro-optical device. According to the present invention, it is possible to provide an electro-optical device and an electronic apparatus that have greater degrees of accuracy and brightness and also have an excellent display quality.

BRIEF DESCRIPTION THE DRAWINGS

DETAILED DESCRIPTION OF THE INVENTION

Embodiments of the present invention will now be described with reference made to the drawings. Note that, in each of the drawings used in the description below, the scale of the respective members has been altered in order to make each member a recognizable size.

First Embodiment

Liquid Crystal Display Device

Figure 1:
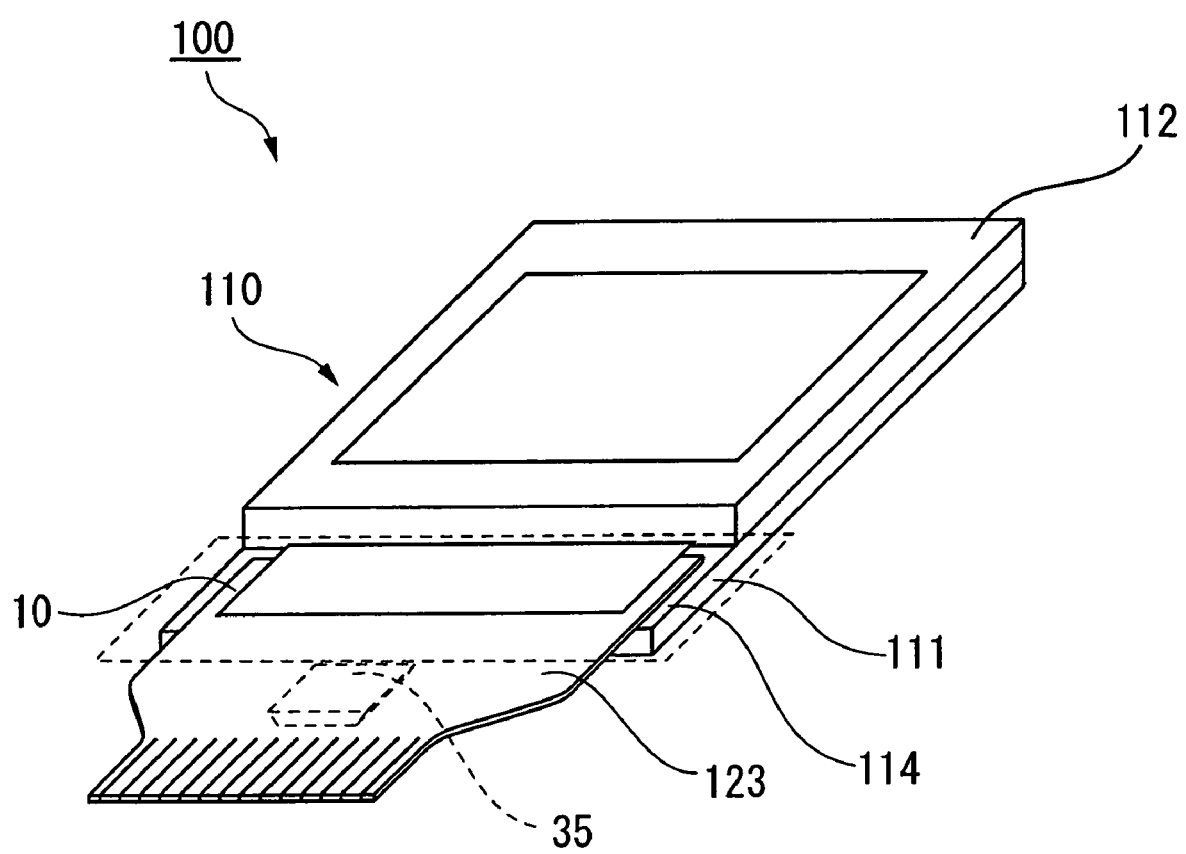
FIG. 1 is a perspective view showing in typical form the liquid crystal display device of the present invention.

FIG. 1 is a perspective view showing in typical form the structure of a liquid crystal display device 100 of the present embodiment. As shown in FIG. 1, the liquid crystal display device 100 is provided with a liquid crystal panel 110 and a flexible substrate 123 (i.e., a second substrate) that is connected to the liquid crystal panel 110.

The liquid crystal panel 110 is provided with a TFT array substrate 111 (i.e., a first substrate) on which are formed a plurality of switching elements and wires and the like (not shown), and a counter substrate 112 that is positioned facing the TFT array substrate 111. Liquid crystal (not shown) is sealed in a space between the TFT array substrate 111 and the counter substrate 112.

A substrate that is larger than the counter substrate 112 is used for the TFT array substrate 111. When the TFT array substrate 111 and the counter substrate 112 are positioned facing each other, they are adhered together such that a peripheral edge portion of the TFT array substrate 111 protrudes outwards. In the present embodiment, this protruding area of the TFT array substrate 111 defines a protruding area 114.

A plurality of TFTs, which are switching elements, and pixel electrodes and the like that are connected to the TFT are formed on the TFT array substrate 111. These TFT are connected to wires such as scan lines and these wires are formed so as to lead to the protruding area 114. In addition, these wires are connected to the flexible substrate 123 via a plurality of protruding electrodes (not shown) that are formed on the protruding area 114.

The flexible substrate 123 is connected to the protruding area 114 of the TFT array substrate 111 via lead-free solder, an anisotropic conductive film (hereinafter abbreviated to ACF) or the like. Specifically, a microstripline 10 that is formed on the flexible substrate 123 is electrically connected to the protruding electrodes that are formed at positions on the TFT array substrate 111 that correspond to the microstripline 10. Moreover, a liquid crystal driving element 35 such as an IC or LSI, which is an electronic component, is mounted on the flexible substrate 123. In the present embodiment, because the liquid crystal driving element 35 is connected to signal lines 14 of the microstripline 10 that are described below, it is mounted on the rear surface of the flexible substrate 123 as shown in FIG. 1. In this manner, predetermined signals such as control signals and video signals are supplied from the liquid crystal driving element 35 to the wires that are formed on the TFT array substrate 111 via the microstripline 10, and drive signals for driving the liquid crystals are output to each pixel.

Structure of Microstripline

Figure 2A:
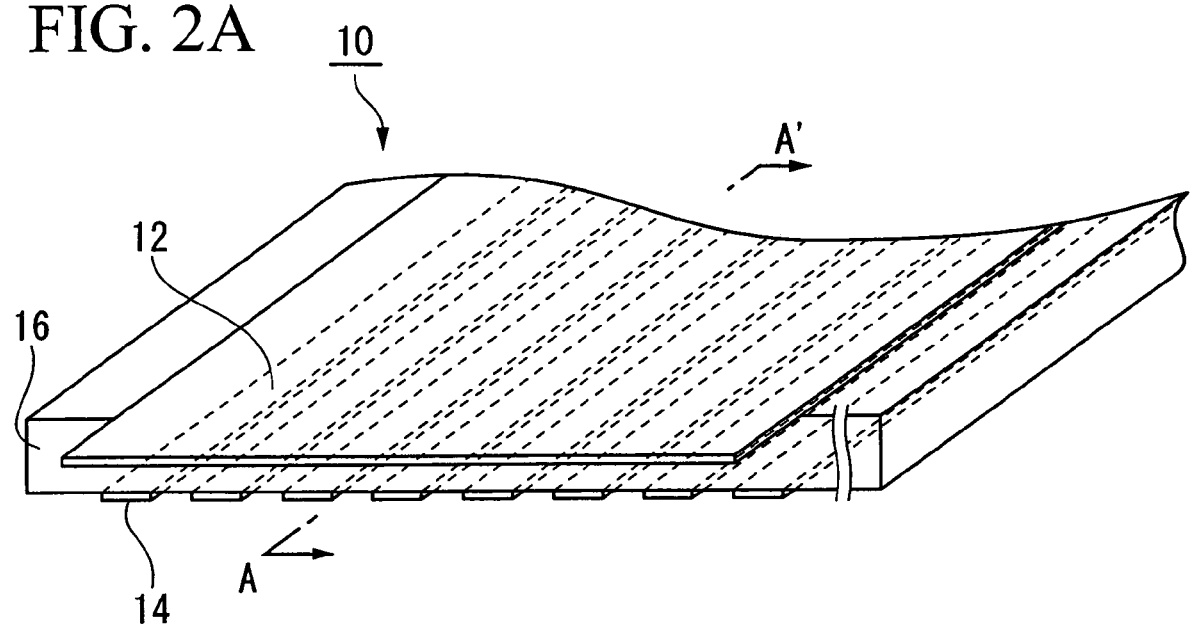
FIGS. 2A and 2B are views showing the microstripline structure of the first embodiment.
Figure 2B:
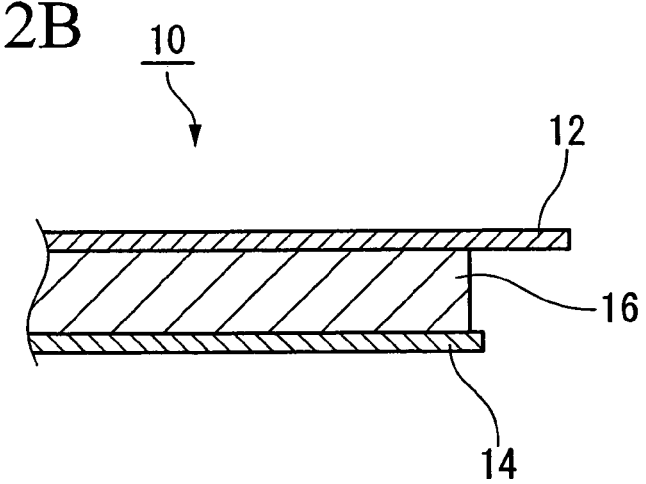

The structure of the microstripline 10 of the present embodiment will now be described with reference made to FIGS. 2A and 2B. FIG. 2A is a perspective view showing the structure of a microstripline 10 of the present embodiment. FIG. 2B is a cross-sectional view taken along a line A-A' in FIG. 2A. Note that, in the description given below, the side of the microstripline 10 that is connected to the TFT array substrate 111 is described simply as a connecting side or as an end portion.

As shown in FIG. 2A, the microstripline 10 is provided with ground wires 12, signal lines 14 (i.e., first conducting portions) that are positioned so as to face the ground wires 12, and an insulating layer 16 that is sandwiched between the ground wires 12 (i.e., a second conducting portion) and the signal lines 14.

The insulating layer 16 constitutes the flexible substrate 123 in the present embodiment. This insulating layer 16 that constitutes the flexible substrate 123 is formed by a polyimide film in which polyimide is used, and is in the form of a flexible print substrate that is able to be bent. In this manner, the microstripline 10 is formed at one end portion of the flexible substrate 123 on the side thereof that is connected to the TFT array substrate 111.

The ground wires 12 are wires that define a reference potential, and are solidly formed on the connecting side of the flexible substrate 123 shown in FIG. 1 on a top surface of the insulating layer 16 which forms the flexible substrate 123. Specifically, the ground wires 12 are formed thinly in a rectangular shape, and the thickness of the ground wires 12 is formed, for example, so as to be smaller than the wavelength of the signals being transmitted.

Moreover, as shown in FIGS. 2A and 2B, one end portion of the ground wires 12 on the side thereof that is connected to the TFT array substrate 111 is formed so as to extend beyond end portions of the connecting sides of the signal lines 14 and the insulating layer 16. Here, it is preferable that the length to which the signal lines 14 extend is 500 µm or less.

A plurality of the signal lines 14 are formed on the bottom surface of the insulating layer 16, which forms the flexible substrate 123, in a striped pattern that run parallel to the direction of the short sides of the microstripline 10 shown in FIG. 2 when seen in plan view so as to face the ground wires 12. In the same manner as the ground wires 12, the signal lines 14 are formed as narrow and thin wires, and the thickness and width of the ground wires 12 are formed so as to be smaller than the wavelength of the signals being transmitted. Moreover, a structure is employed in which the signal lines 14 are formed such that end portions thereof substantially overlap with the end portion of the insulating layer 16, and in which the solidly formed ground wires 12 are made to extend past end portions of the insulating layer 16 and the signal lines 14. Moreover, the signal lines 14 supply high frequency signals that are output from the liquid crystal driving element 35 that is mounted on the flexible substrate 123 to the TFT array substrate 111. The other end portions of the signal lines 14 are connected to connecting terminal portions of the liquid crystal driving element 35 that is mounted on the rear surface of the flexible substrate 123.

According to the present embodiment, the above-described microstripline 10 is used as connecting means to connect the flexible substrate 123 to the TFT array substrate 111. Accordingly, by considering the thickness of the insulating layer 16 and the thickness and width of the signal lines 14 of the microstripline 10, it is possible to control characteristic impedance generated in the signal lines 14.

Moreover, because the ground wires 12 are solidly formed on the top surface of the flexible substrate 123, it is not necessary to form the ground wires 12 in a striped pattern or the like as in the embodiment described below, and the manufacturing process can be streamlined.

Figure 3A:
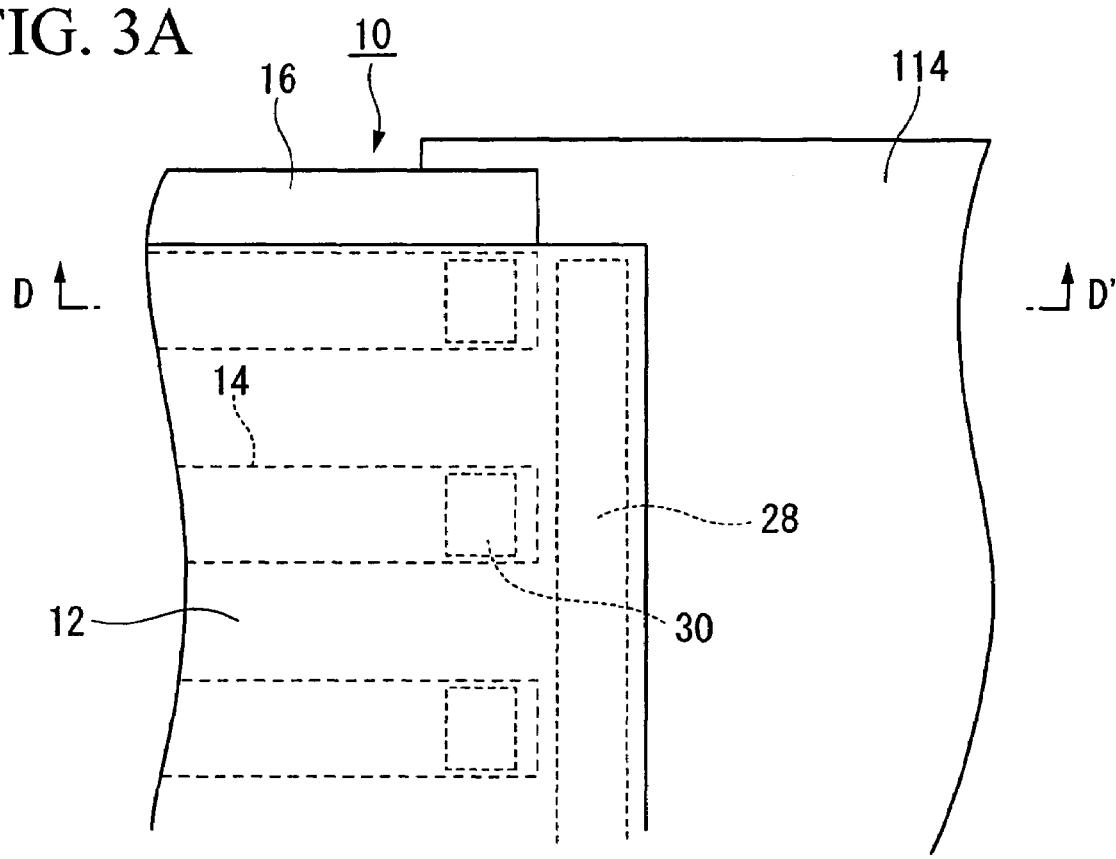
FIGS. 3A and 3B are a plan view and a cross-sectional view showing a connecting structure for connecting a microstripline and a TFT array substrate of the first embodiment.
Figure 3B:
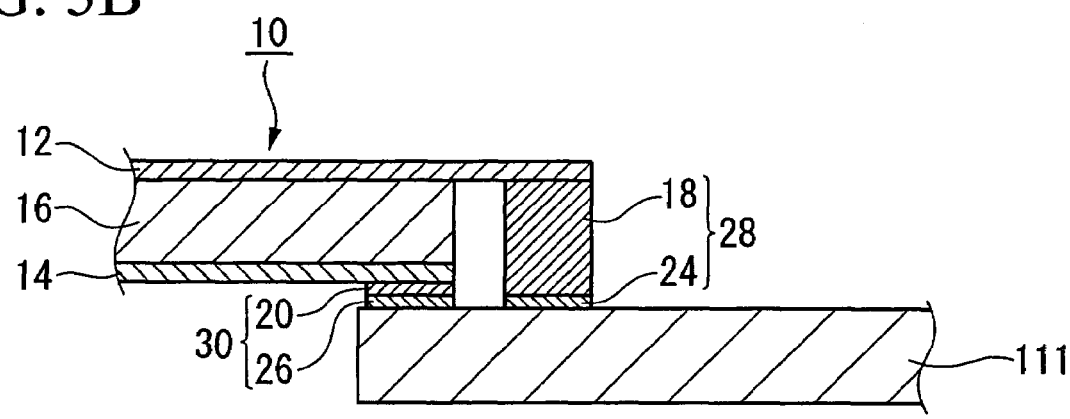

Connecting Structure between Microstripline (i.e., the Flexible Substrate) and TFT Array Substrate FIGS. 3A and 3B are enlarged views of the broken line portion shown in FIG. 1. Note that, in the description given below, the connecting structure between the microstripline and the TFT array substrate is described in detail, and a description of the remainder of the wires and the like that are formed on the TFT array substrate is omitted.

FIG. 3A is an enlarged view of a connecting portion between a flexible substrate and a TFT array substrate as seen from a top surface thereof. FIG. 3B is a cross-sectional view taken along a line D-D' shown in FIG. 3A.

As shown in FIG. 3A, a plurality of signal line protruding electrodes 30 are formed on the protruding area 114 of the TFT array substrate 111 so as to correspond to the positions of the end portions of the signal lines 14 of the microstripline 10 that is to be connected. Furthermore, a plurality of ground wire protruding electrodes 28 are formed so as to correspond to the positions of end portions of the ground wires 12 of the microstripline 10. Each of these protruding electrodes is formed along the long side of the connecting side of the protruding area 114 so as to correspond to each of the signal lines 14 and the ground wires 12 that are formed in a striped pattern. Moreover, the ground wire protruding electrodes 28 and the signal line protruding electrodes 30 are formed with a space between them within the range of the distance that the ground wires 12 extend beyond the signal lines 14 so that the ground wire protruding electrodes 28 and the signal line protruding electrodes 30 do not make contact with each other.

The ground wire protruding electrodes 28 include ground wire electrode terminals 24 and ground wire bumps 18 (i.e., second convex portions). In the same manner, the signal line protruding electrodes 30 include signal line electrode terminals 26 and signal line bumps 20 (i.e., first convex portions). The ground wire electrode terminals 24 and the signal line electrode terminals 26 include a metal such as Al or the like. The signal line bumps 20 and the ground wire bumps 18 are formed in a hemispherical shape from a metal such as Au, Cu, solder, Ni, or the like. Note that the ground wire bumps 18 and the signal line bumps 20 are not limited to a hemispherical shape and may be formed in a variety of shapes such as a truncated cone shape, a truncated pyramid shape, a columnar shape, a rectangular column shape, or the like.

A distinctive feature of the present embodiment is that the ground wire bumps 18 are formed higher than the height of the signal line bumps 20. Specifically, the ground wire bumps 18 are formed at approximately a height that is obtained by combining the heights of the signal line bumps 20, the signal lines 14, and the insulating layer 16. By forming the ground wire bumps 18 in this manner, it is possible to connect the signal lines 14 and the ground wires 12 of the microstripline 10 simultaneously to the protruding area of the TFT array substrate 111.

As shown in FIGS. 3A and 3B, the microstripline 10 that is formed on the flexible strip 123 is connected to the top of the protruding area 114 of the TFT array substrate 111. Specifically, the ground wires 12 that are formed extending from the microstripline 10 is electrically connected to the ground wire protruding electrodes 28 that are formed on the protruding area 114. In the same manner, the signal lines 14 of the microstripline 10 are electrically connected to the signal line protruding electrodes 30 that are formed on the protruding area 114. It is preferable that electrical connections between the microstripline 10 and the protruding electrodes are achieved by using an ACF, NCP (non-conductive paste), or a lead-free solder or the like that is provided on end portions of the protruding electrodes.

Note that, in the present embodiment, it is preferable that the ground wire bumps 18 are formed on a bottom surface (i.e., a connecting surface) of the connecting side portion of the ground wires 12, and that they are electrically connected using the bonding material to the ground wire electrode terminals 24 that are formed on the TFT array substrate 111. In the same manner, it is preferable that the signal line bumps 20 be formed on a bottom surface (i.e., a connecting surface) of the connecting side portion of the signal lines 14, and that they are electrically connected using the bonding material to the signal line electrode terminals 26 that are formed on the TFT array substrate 111.

When a connection is made to the protruding area 114 of the TFT array substrate 111 using the microstripline 10 described above, as shown in FIGS. 3A and 3B, the plurality of ground wires 12 that are solidly formed are made to extend in a perpendicular direction relative to the side on the connecting side of the flexible substrate 123.

According to the present embodiment, the ground wires 12 that are formed on the flexible substrate 123 extend beyond the signal lines 14, while the ground wire bumps 18 that are formed on the TFT array substrate 111 are formed higher than the signal line bumps 20. Because of this, it is possible to connect both the ground wires 12 and the signal lines 14 simultaneously to the active surface of the TFT array substrate 111. As a result, in the connecting process, only the active surface (i.e., only one surface) of the flexible substrate 123 needs to be handled when it is connected to the TFT array substrate 111.

Moreover, the flexible substrate 123 is connected to the active surface (i.e., to one surface) of the TFT array substrate 111. Accordingly, when the ground wires 12 and signal lines 14 are each connected respectively to the ground wire protruding electrodes 28 and signal line protruding electrodes 30 of the TFT array substrate 111, the alignment in this processing step is easier compared with when the connections are made to the two surfaces of the TFT array substrate 111.

Furthermore, the ground wires 12 of the flexible substrate 123 are formed so as to extend beyond the signal lines 14 and the insulating layer 16. Accordingly, when the flexible substrate 123 is connected to the TFT array substrate 111, it is possible to match the characteristic impedance that is caused by the condenser component and the inductor component of the signal line 14 and the like as far as the extended end portion of the ground wires 12 of the microstripline 10 on the active surface of the TFT array substrate 111. As a result, it is possible to suppress any rounding of the signal waveform, and it becomes possible to transmit a higher quality signal at a faster speed.

Method of Connecting Microstripline to TFT Array Substrate

Firstly, the method for forming the ground wire bumps 18 and the signal line bumps 20 will be described.

Firstly, ground wire pads and signal line pads that are made of Al are immersed in a solution for treatment in order to improve the surface wettability thereof and remove any residue. Next, they are immersed in a sodium hydroxide-based alkaline aqueous solution that has been heated to a predetermined temperature, so that any surface oxide film is removed. Next, they are immersed in a zincate solution that contains ZnO so that the surfaces of the ground wire pads and signal line pads that are made from Al are substituted by Zn. Next, the ground wire pads and signal line pads are immersed in a nitric acid aqueous solution so that the Zn is peeled off. Next, they are once again immersed in the zincate bath so that minute Zn particles are deposited on the surface of the Al. Next, they are immersed in an electroless Ni plating bath so that Ni plating is formed. At this stage, the ground wire bumps 18 are formed higher than the signal line bumps 20. To achieve this, the ground wire bumps 18 and the signal line bumps 20 are formed, for example, such that the signal line bumps 20 and the ground wire bumps 18 grow for a certain length of time, and thereafter, the signal line bumps are coated with a plating resist or the like so that only the ground wire bumps 18 continue to grow. In this manner, the ground wire bumps 18 are formed so as to be higher than the heights of each of the insulating layer 16, i.e., the flexible substrate 123, and the signal lines 14 and the signal line bumps 20 that are formed on the bottom surface of the insulating layer 16.

Lastly, the ground wire bumps 18 and the signal line bumps 20 are immersed in a substituent Au plating bath so that the Ni surface of the bumps is replaced by Au. In this manner, Ni—Au bumps (i.e., the ground wire bumps 28 and the signal line bumps 20) are formed on the ground wire pads and signal line pads that are made of Al. It is also preferable that lead-free solder is formed by screen-printing or dipping or the like on the Ni—Au plated bumps.

Next, the method for forming the microstripline 10 will be described with reference made to FIG. 4.

Figure 4:
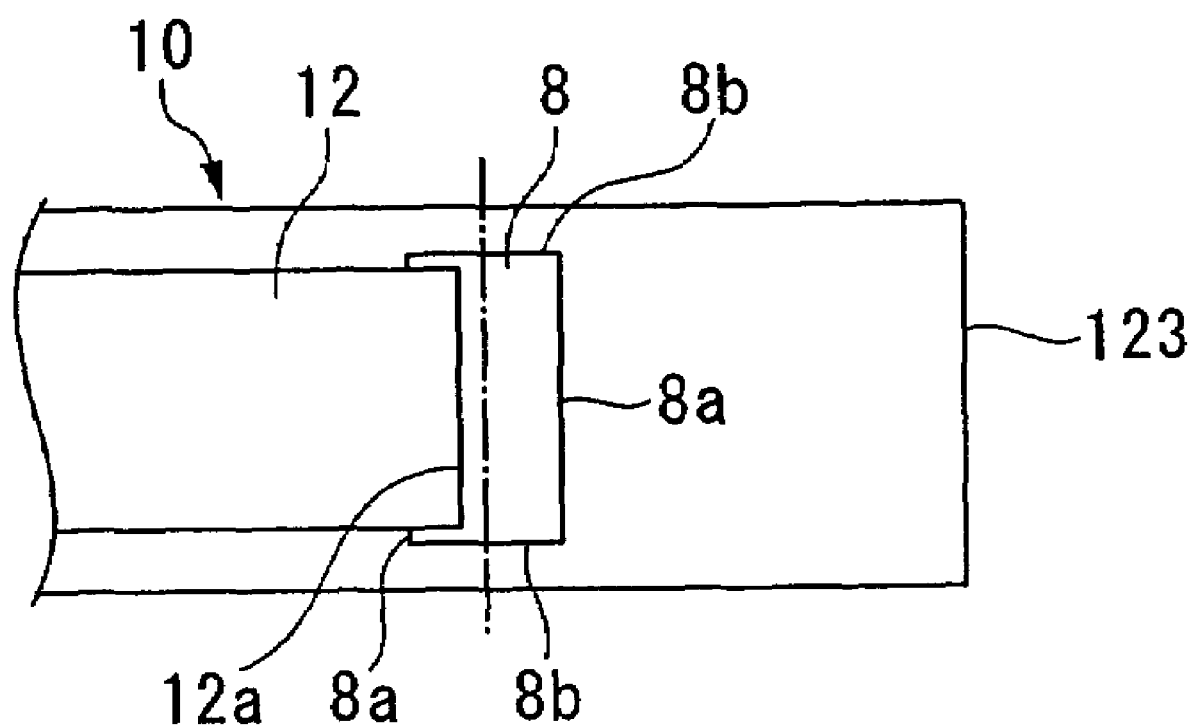
FIG. 4 is a plan view showing a microstripline formation method.

FIG. 4 is a view showing a method for forming the microstripline 10 by extending the ground wires 12 beyond the signal lines 14 and the like.

Firstly, as shown in FIG. 4, a flexible substrate 123 in which a rectangular aperture 8 is defined is provided. The aperture 8 that is provided in the flexible substrate 123 may have, for example, long sides 8a that are defined so as to be longer than the short sides of the ground wires 12, and short sides 8b that are defined so as to be longer than the length which the ground wires 12 extend.

Next, copper foil is adhered to the top surface of the flexible substrate 123. The film thickness of this copper foil may be, for example, approximately 18 μm to 35 μm. At this time, the copper foil is adhered such that a end portion of the copper foil extends beyond one long side (i.e., the left side in FIG. 4) of the aperture 8 that is formed on the flexible substrate 123. This extending end portion of the adhered copper foil corresponds to the aforementioned extended portion of the ground wires 12.

Next, photoresist is coated on the entire surface of the copper foil that has been adhered to the flexible substrate 123, and the copper foil is patterned in a predetermined configuration by being exposed and developed using a photolithographic technique. In the present embodiment, the copper foil is patterned solidly so as to form the ground wires 12.

In the same manner, copper foil is adhered to the bottom surface of the flexible substrate 123. The side 12a of the copper foil is adhered to the flexible substrate 123 such that it does not protrude from a long side 8a (i.e., the left side in FIG. 4) of the aperture that is provided in the flexible substrate 123. Next, the adhered copper foil is patterned in a striped pattern by being exposed and developed using a photolithographic technique. By patterning the copper foil in a striped pattern in this manner, the line-shaped signal lines 14 (not shown in FIG. 4) are formed on the bottom surface of the flexible substrate 123.

Next, as shown in FIG. 4, the flexible substrate 123 is cut along the alternate long and short dashed line in FIG. 4 such that the ground wires 12 that are formed on the top surface of the flexible substrate 123 extend beyond the end portions on the TFT array substrate 111 side of the insulating layer 16 and the signal lines 14. As a result of this, the ground wires 12 are able to be extended beyond the end portions of the insulating layer 16 and the signal lines 14.

By performing the above-described process, the microstripline 10 of the present embodiment is formed.

Next, the microstripline 10 of the flexible substrate 123 that is formed using the above-described process is connected to the TFT array substrate 111 using a bonding apparatus (not shown). Here, a head of the bonding apparatus is provided with a vacuum suction mechanism and a heating mechanism.

The bonding apparatus uses suction to hold the flexible substrate 123 and moves the flexible substrate 123 to a position above the protruding electrodes that are formed in the protruding area 114 of the TFT array substrate 111. The microstripline 10 is then aligned to the protruding electrodes that are formed in the protruding area 114 and is connected. Heat and pressure are then applied thereto. Here, as described above, the lead-free solder, ACF, ACP (anisotropic conductive paste) that was formed on top of the ground wire bumps 18 and the signal line bumps 20, or some other appropriate bonding material can be used as the bonding material.

As a result of this, it is possible to electrically connect the ground wires 12 of the flexible substrate 123 that are formed so as to extend outwards with the ground wire projection electrodes that are formed so as to be higher than the signal line projection electrodes of the TFT array substrate 111. In the same manner, it is possible to electrically connect the signal lines 14 with the signal line projection electrodes of the TFT array substrate 111.

Note that it is also possible to employ a metal bond such as Au—Au, Au—Sn, or the like in the connection between the microstripline 10 and the TFT array substrate 111. In the electrode, these two materials may be bonded together by applying pressure only, heat only, ultrasonic vibration only, or a combination of ultrasonic vibration with other methods. When bonded together, a metal bond is formed as a result of the materials provided on the electrode being diffused by the vibration or heat.

Second Embodiment

This embodiment will now be described with reference made to FIGS. 5A and 5B.

In the above-described first embodiment, the ground wires 12 of the microstripline 10 are formed extending outwards. Furthermore, the ground wire protruding electrodes 28 that have been formed higher than the signal line protruding electrodes 30 are formed on the protruding area 114 of the TFT array substrate 111 or on the ground wires 12 and signal lines 14 that are formed on the flexible substrate 123 side. These are then electrically connected. In contrast to this, the present embodiment differs in that via holes that extend from the ground wires 12 to the signal lines 14 are formed in the insulating layer 16 corresponding to the position of the end portion of the ground wires 12, and these via holes are electrically connected to the ground wire protruding electrodes 28 that are formed on the TFT array substrate 111. Note that the remainder of the basic structure of the microstripline 10 is the same as in the above-described first embodiment. Consequently, the same reference symbols are used for the same component elements and a detailed description thereof is omitted.

Figure 5A:
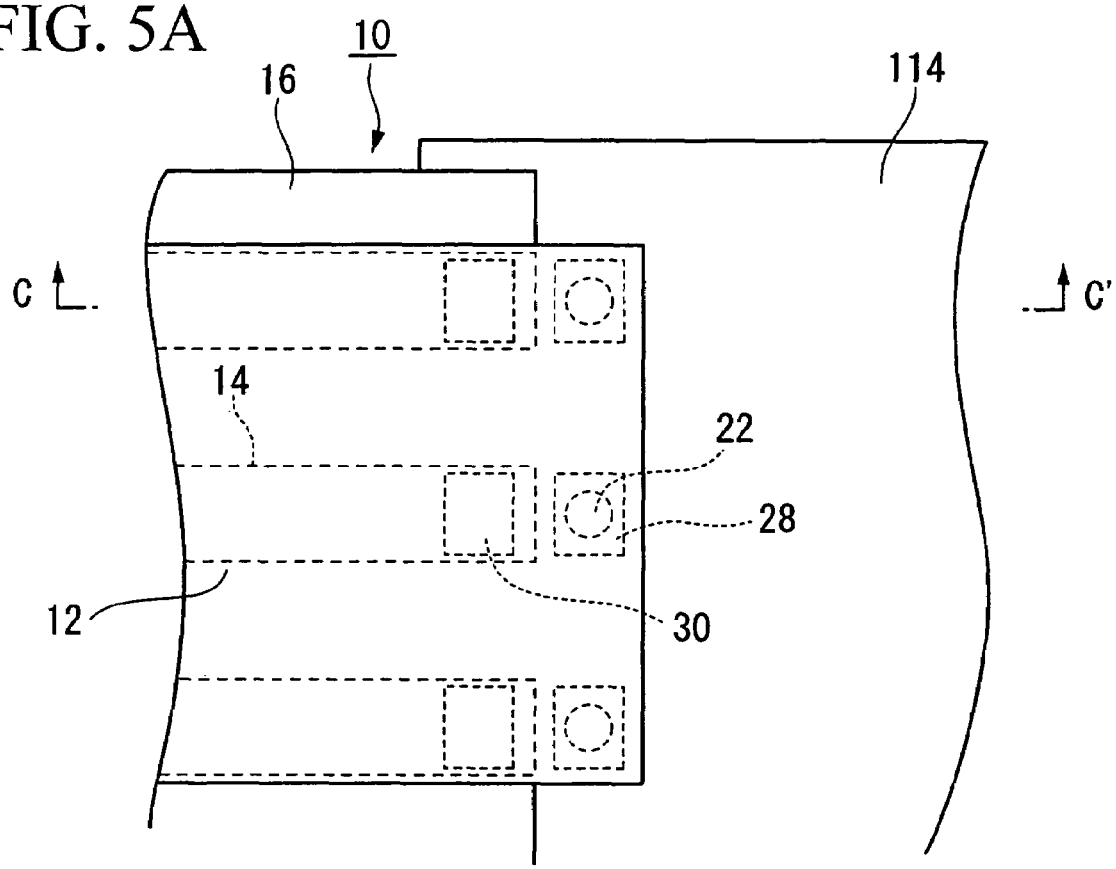
FIGS. 5A and 5B are a plan view and a cross-sectional view showing a connecting structure for connecting a microstripline and a TFT array substrate of the second embodiment.

FIG. 5A is an enlarged view showing a connection portion between a flexible substrate and a TFT array substrate as seen from a top surface thereof. FIG. 5B is a cross-sectional view taken along the line C-C' in FIG. 5A.

Figure 5B:
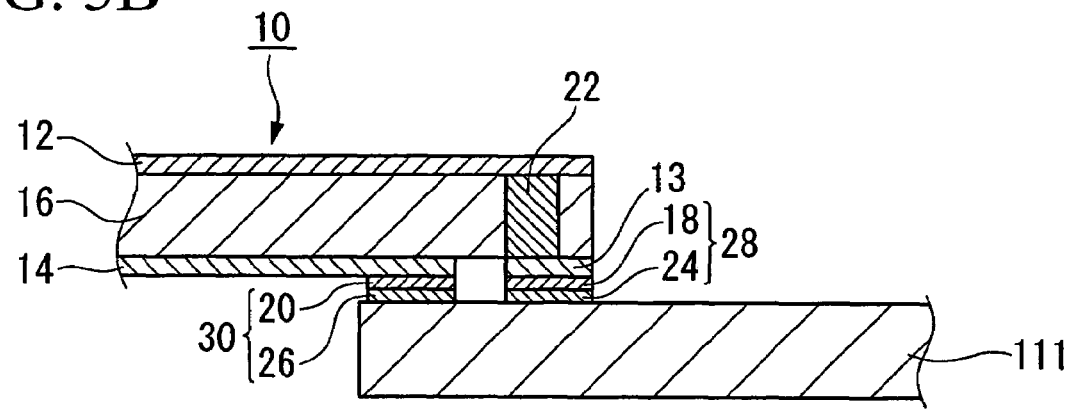

As shown in FIGS. 5A and 5B, the ground wires 12, the signal lines 14, and the insulating layer 16 that is sandwiched by these wires of the microstripline 10 is formed such that the end portions thereof on the TFT array substrate 111 side overlap each other. Moreover, as shown in FIG. 5B, the end portions of the signal lines 14 that are formed on a bottom surface of the insulating layer 16 are shorter than the end portions of the ground wires 12 and the insulating layer 16, so that the end portion on the bottom surface of the insulating layer 16 is exposed. An intermediate layer 13 that comes between and connects the ground wires 12 and the ground wire bumps 18 is formed on the exposed portion of the insulating layer 16. The signal lines 14 and the intermediate layer 13 are formed with a space between them, and patterning is performed so as to insulate the signal lines 14 and the intermediate layer 13. Note that, when forming the intermediate layer 13, the end portions on the connection side of the signal lines 14 are formed by performing patterning to open up the space between the intermediate layer 13 and the signal lines 14.

Via holes 22 having a predetermined aspect ratio are formed in the insulating layer 16 that is sandwiched between the intermediate layer 13 and the ground wires 12 extending from the ground wire 12 side to the signal line 14 side. The interior of these via holes 22 is filled with a conductive material such as Cu, Au, or the like using an electroplating technique, so that the ground wires 12 and the intermediate layer 13 are electrically connected.

A microstripline 10 having the above-described type of structure is connected to the top of the protruding area 114 of the TFT array substrate 111, as shown in FIGS. 5A and 5B. Specifically, the ground wires 12 of the microstripline 10 that are formed extending outwards are electrically connected by the via holes 22 that are formed in the insulating layer 16 and the intermediate layer 13 to the ground wire protruding electrodes 28 that are formed on the protruding area 114. In the same manner, the signal lines 14 of the microstripline 10 are electrically connected to the signal line protruding electrodes 30 that are formed on the protruding area 114.

According to the present embodiment, the signal lines 14 of the flexible substrate 123 are formed so as to be separated into the intermediate layers 13 of the ground wires 12 and the signal lines 14. As a result, using a photolithographic technique, it is possible to separate the ground wires 12 into the intermediate layers 13 and the signal lines 14 and pattern them. Accordingly, the manufacturing process is simplified compared with when the ground wires 12 of the flexible substrate 123 are formed in an extended shape, as described above.

Moreover, because the ground wires 12 of the flexible substrate 123 extend further than the signal lines 14, it is possible to match the characteristic impedance that is caused by the condenser component and the inductor component and the like as far as the end portions on the connection side of the ground wires 12.

Third Embodiment

This embodiment will now be described with reference made to FIGS. 6A and 6B.

In the above-described first and second embodiments, when connecting the flexible substrate 123 to the TFT array substrate 111, the microstripline 10 that is formed on the flexible substrate 123 side is connected to the electrode terminals that are connected to the wires on the TFT array substrate 111 side. In contrast to this, the present embodiment differs in that a microstripline 38 is used for the wires on the TFT array substrate 111 side as well. Note that because the basic structure of the microstripline 10 is the same as that of the above-described second embodiment, the same reference symbols are used for the same component elements and a detailed description thereof is omitted.

Figure 6A:
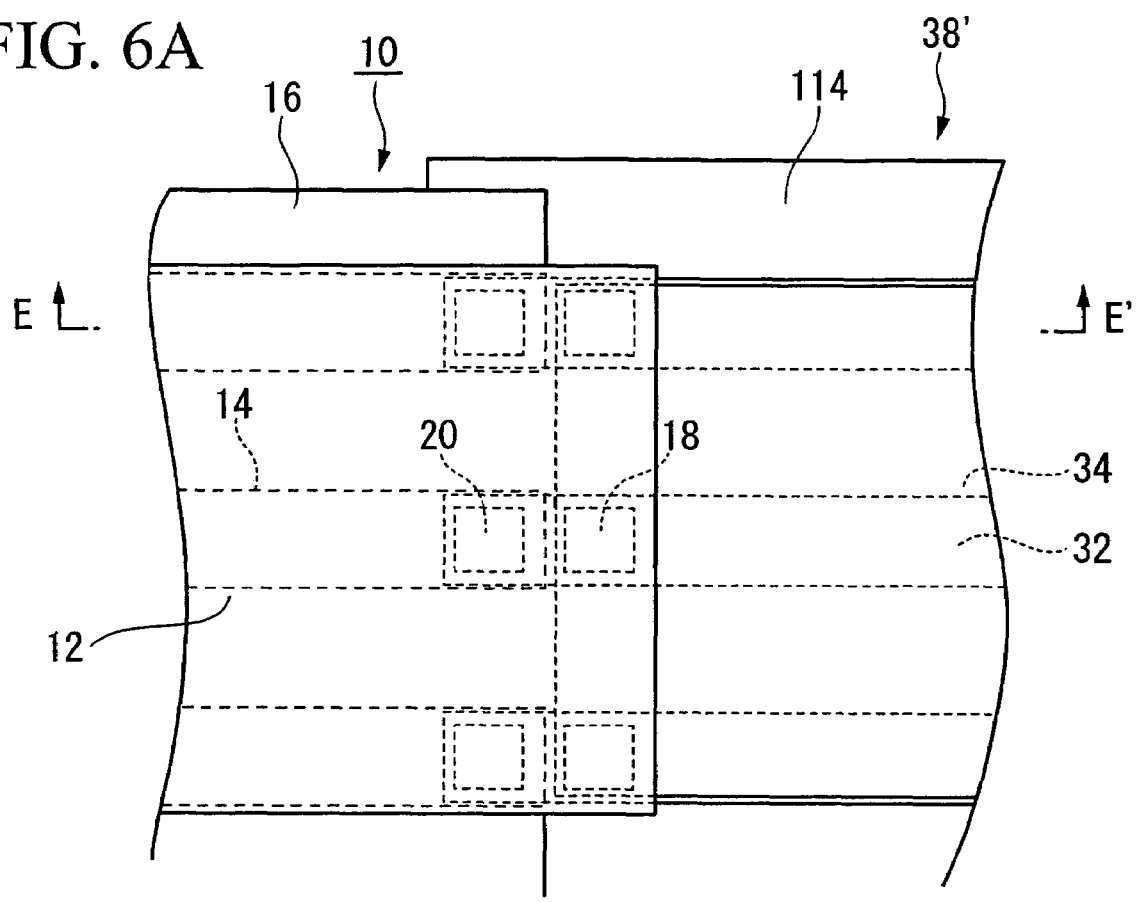
FIGS. 6A and 6B are a plan view and a cross-sectional view showing a connecting structure for connecting a microstripline and a TFT array substrate of the third embodiment.

FIG. 6A is an enlarged view showing a connection portion between a flexible substrate and the TFT array substrate 111 as seen from a top surface thereof. FIG. 6B is a cross-sectional view taken along the line E-E' in FIG. 6A.

Figure 6B:
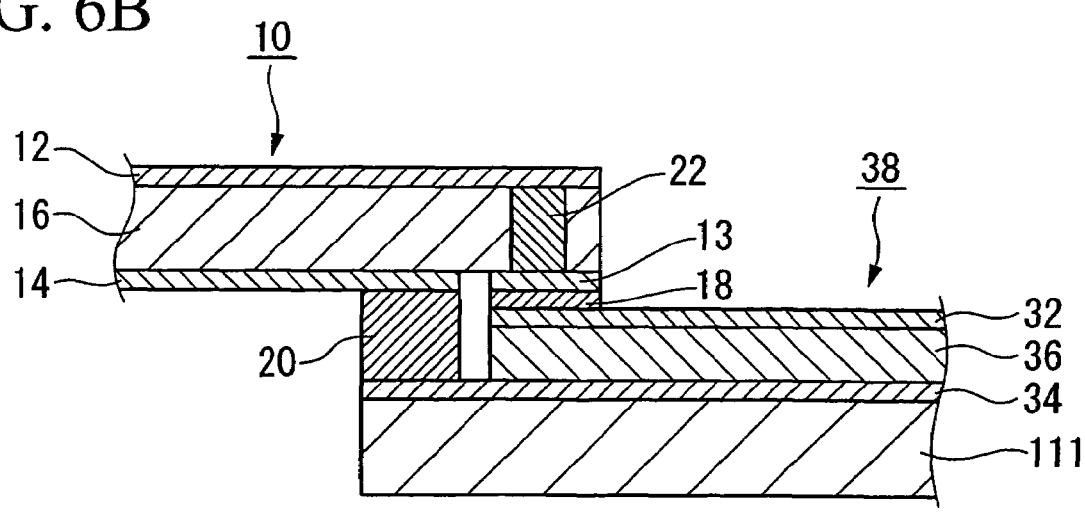

As shown in FIGS. 6A and 6B, ground wires 32 (i.e., fourth conducting portions) that constitute the microstripline 38 on the TFT array substrate 111 side is solidly formed on the protruding area 114 on the active surface side of the TFT array substrate 111. Moreover, a plurality of signal lines 34 (i.e., third conducting portions) are formed in a striped pattern running in the direction of the short sides of the protruding area 114 on the protruding area 114 on the active surface of the TFT array substrate 111.

The ground wires 32 are formed on a top surface of an insulating layer 36, and the signal lines 34 are formed on a bottom surface of the insulating layer 36. A bottom surface of the signal lines 34 is in contact with the active surface of the TFT array substrate 111. In addition, the ground wires 32 and signal lines 34 on the TFT array substrate 111 side of the microstripline 38 are formed so as to overlap with the respective positions of the ground wires 12 and signal lines 14 on the flexible substrate 123 side of the microstripline 10. Moreover, unlike in the above-described first embodiment, the signal lines 34 on the flexible substrate 123 side of the microstripline 38 are formed so as to extend beyond the end portions on the connection side of the insulating layer 36 and the ground wires 32.

As shown in FIG. 6B, ground wire bumps 18 are formed on end portions on the connecting side of the ground wires 32 of the microstripline 38. Moreover, signal line bumps 20 are formed on end portions on the connecting side of the signal lines 34 so as to be at the same height as the position where the ground wire bumps 18 are formed. Specifically, the height of the signal line bumps 20 is approximately a height that is obtained by combining the thicknesses of the ground wires 32 and the insulating layer 36 of the microstripline 38, and also of the ground wire bumps 18 that are formed on the ground wires 32.

Note that, as described above, it is preferable that the ground wire bumps 18 and the signal line bumps 20 be formed on each of the ground wires 12 and signal lines 14 of the microstripline 10 that is formed on the flexible substrate 123 side. Moreover, it is also possible to use the ground wires 12 and 32 shown in FIGS. 6A and 6B as signal lines and to use the signal lines 14 and 34 as ground wires.

The microstripline 38 on the TFT array substrate 111 side that has this type of structure is electrically connected to the microstripline 10 that is formed on the flexible substrate 123 being connected. Specifically, as shown in FIGS. 6A and 6B, the ground wires 12 on the microstripline 10 on the flexible substrate 123 side are electrically connected via the via holes 22 formed in the insulating film 16 and the intermediate layer 13 to the ground wire bumps 18 that are formed on the TFT array substrate 111. In the same manner, the signal lines 14 on the microstripline 10 are electrically connected via the signal line bumps 20 formed on the protruding area 114 to the signal lines 34 of the microstripline 38 on the TFT array substrate 111 side.

According to the present embodiment, it is possible to connect the TFT array substrate 111 to the flexible substrate 123 using the microstriplines 10 and 38. Because of this, it is possible to match the characteristic impedance from the microstripline 10 on the flexible substrate 123 side as far as the microstripline 38 on the TFT array substrate 111 side. Accordingly, compared with when the microstripline 10 is only used on the flexible substrate 123 side, because the microstripline 38 is also used on the TFT array substrate 111 side, it becomes possible to transmit a higher quality signal at a faster speed.

Moreover, the microstripline 10 that has extending ground wires 12 is used on the flexible substrate 123 side, while the microstripline 38 that has extending signal lines 14 is used on the TFT array substrate 111 side. As a result, it is possible to simultaneously connect the ground wires 12 and the signal lines 14 of the microstripline 10 to the active surface on the TFT array substrate 111 side.

Fourth Embodiment

This embodiment will now be described with reference made to FIGS. 7A and 7B.

In the above-described first through third embodiments, the ground wires 12 that are formed on the flexible substrate 123 is solidly formed. In contrast to this, the present embodiment differs in that the ground wires 12 that are formed on the flexible substrate 123 are formed in a striped configuration. Note that because the basic structure of the microstripline 10 is the same as that of the above-described first through third embodiments, the same reference symbols are used for the same component elements and a detailed description thereof is omitted.

The structure of the microstripline 10 of the present embodiment will now be described with reference made to FIGS. 7A and 7B. FIG. 7A is a perspective view showing the structure of a microstripline 10 of the present embodiment. FIG. 7B is a cross-sectional view taken along a line A-A' in FIG. 7A. Note that, in the description given below, the side of the microstripline 10 that is connected to the TFT array substrate 111 is described simply as a connecting side or as an end portion.

Structure of Microstripline

Figure 7A:
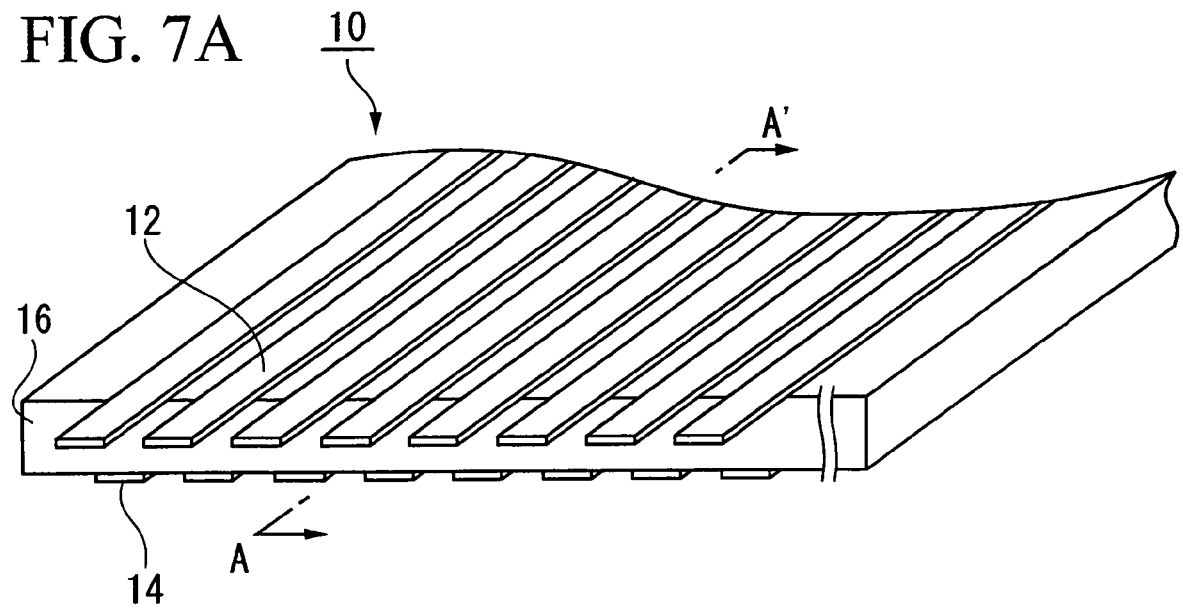
FIGS. 7A and 7B are views showing the structure of a microstripline of the fourth embodiment.

As shown in FIG. 7A, the microstripline 10 is provided with ground wires 12, signal lines 14 (i.e., first conducting portions) that are positioned so as to face the ground wire 12, and an insulating layer 16 that is sandwiched between the ground wire 12 (i.e., a second conducting portion) and the signal lines 14.

In the present embodiment, the ground wires 12 are wires that define a reference potential, and a plurality of the ground wires 12 are formed in a striped pattern running in the direction of the short sides of the microstripline 10 shown in FIG. 7A, when seen in plan view, on a top surface of the insulating layer 16 which forms the flexible substrate 123. These ground wires 12 are formed in narrow, thin lines, and the thickness and width of the ground wires 12 are formed so as to be smaller than the wavelength of the signals being transmitted.

Figure 7B:
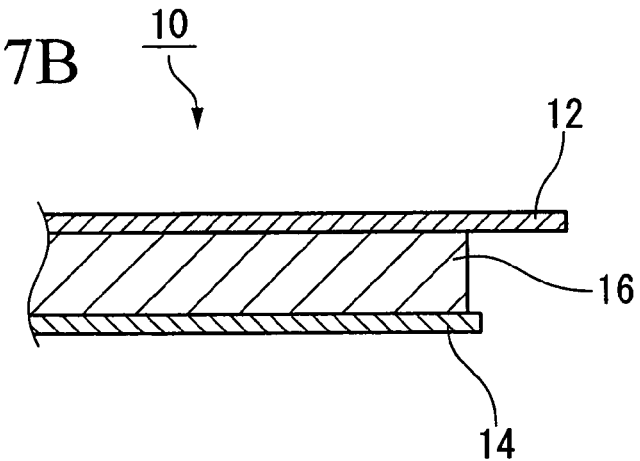

Moreover, as shown in FIGS. 7A and 7B, one end portion of the ground wires 12 on the side thereof that is connected to the TFT array substrate 111 is formed so as to extend beyond end portions of the connecting sides of the signal lines 14 and the insulating layer 16. Here, it is preferable that the length to which the signal lines 14 extend be 500 µm or less. The other end portions of the ground wires 12 are connected to connecting terminal portions of the liquid crystal driving element 35 that is mounted on the rear surface of the flexible substrate 123 shown in FIG. 1.

According to the present embodiment, the above-described microstripline 10 is used as connecting means to connect the flexible substrate 123 to the TFT array substrate 111. Accordingly, by considering the thickness of the insulating layer 16 and the thickness and width of the signal lines 14 of the microstripline 10, it is possible to control characteristic impedance generated in the signal lines 14.

Figure 8A:
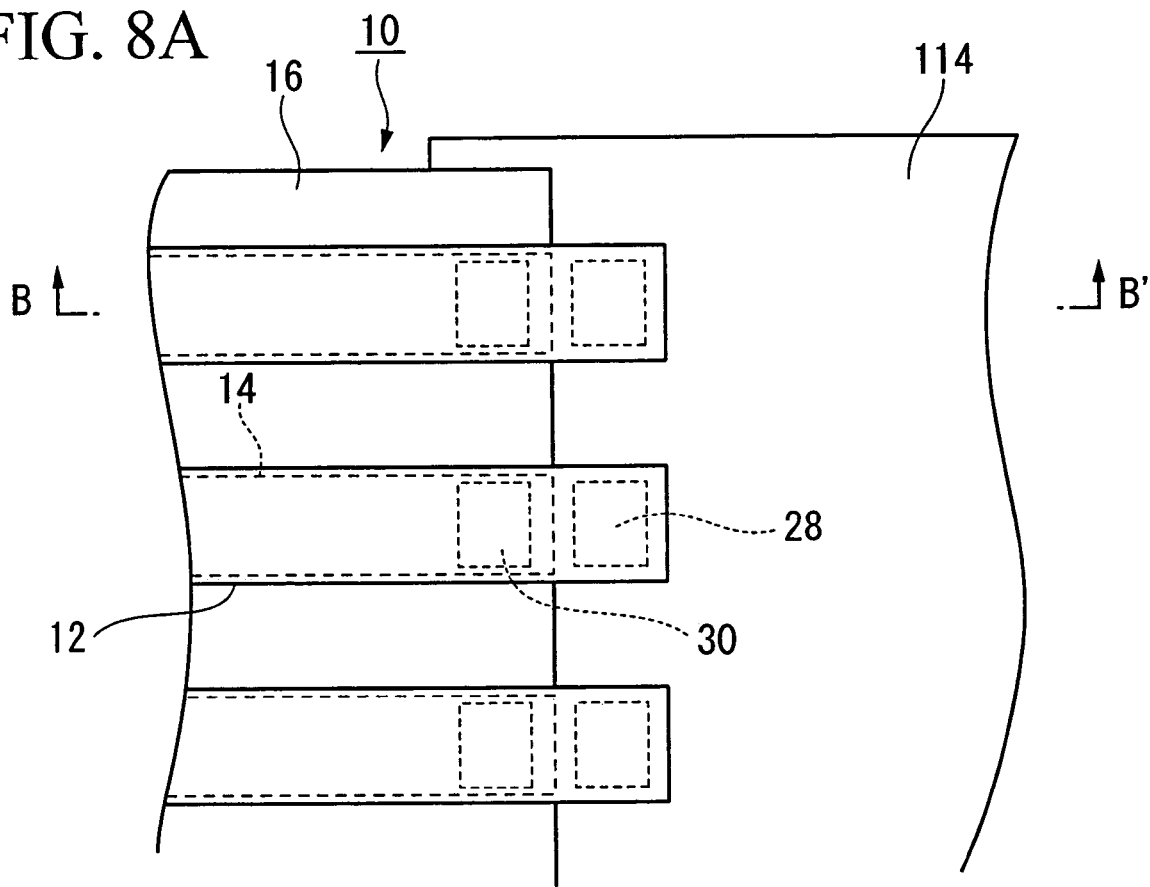
FIGS. 8A and 8B are a plan view and a cross-sectional view showing a connecting structure for connecting a microstripline and a TFT array substrate of the fourth embodiment.
Figure 8B:
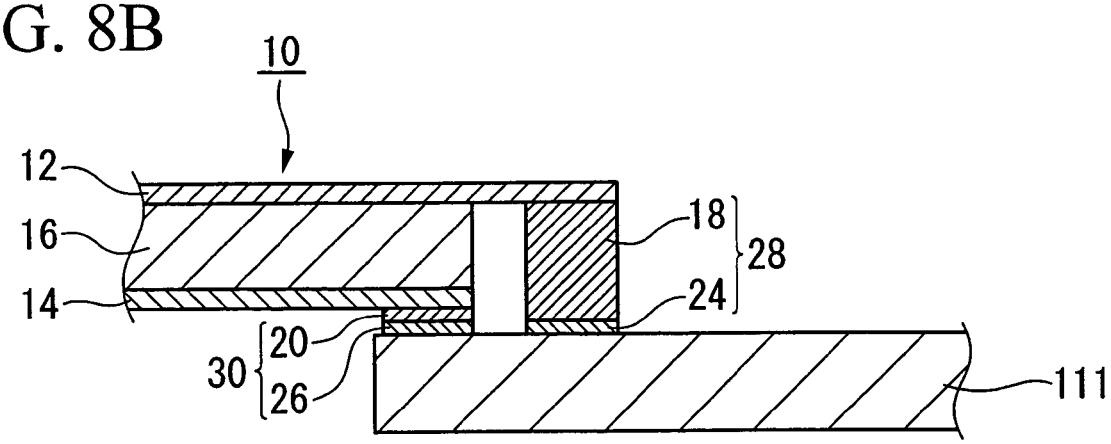

Connecting Structure between Microstripline (i.e., the Flexible Substrate) and TFT Array Substrate FIGS. 8A and 8B are enlarged views of the broken line portion shown in FIGS. 7A and 7B. Note that, in the description given below, the connecting structure between the microstripline and the TFT array substrate is described in detail, and a description of the remainder of the wires and the like that are formed on the TFT array substrate is omitted. In addition, because the signal line protruding electrodes and the like are the same component elements as those in the first through third embodiments, a description of these is also omitted.

FIG. 8A is an enlarged view of a connecting portion between a flexible substrate and a TFT array substrate as seen from a top surface thereof. FIG. 8B is a cross-sectional view taken along a line B-B' shown in FIG. 8A.

As shown in FIG. 8A, a plurality of ground wire protruding electrodes 28 are formed on the protruding area 114 of the TFT array substrate 111 so as to correspond to the positions of the end portions of the ground wires 12 of the microstripline 10 that is to be connected. These protruding electrodes 28 are formed along the long side of the connecting side of the protruding area 114 so as to correspond to each of the ground wires 12 that are formed in a striped configuration. Moreover, the ground wire protruding electrodes 28 and the signal line protruding electrodes 30 are formed with a space between them within the range of the distance that the ground wires 12 extend beyond the signal lines 14 such that the ground wire protruding electrodes 28 and the signal line protruding electrodes 30 do not make contact with each other.

The ground wire protruding electrodes 28 include ground wire electrode terminals 24 and ground wire bumps 18 (i.e., second convex portions). The ground wire electrode terminals 24 are formed from a metal such as Al or the like. The ground wire bumps 18 are formed in a hemispherical shape from a metal such as Au, Cu, or the like. Note that the ground wire bumps 18 are not limited to a hemispherical shape and may be formed in a variety of shapes such as a truncated cone shape, a truncated pyramid shape, a columnar shape, or a rectangular column shape, or the like.

A distinctive feature of the present embodiment is that the ground wire bumps 18 are formed higher than the height of the signal line bumps 20. Specifically, the ground wire bumps 18 are formed at approximately a height that is obtained by combining the heights of the signal line bumps 20, the signal lines 14, and the insulating layer 16. By forming the ground wire bumps 18 in this manner, it is possible to connect the signal lines 14 and the ground wires 12 of the microstripline 10 simultaneously to the protruding area of the TFT array substrate 111.

As shown in FIGS. 8A and 8B, the microstripline 10 that is formed on the flexible strip 123 is connected to the top of the protruding area 114 of the TFT array substrate 111. Specifically, the ground wires 12 that are formed extending from the microstripline 10 are electrically connected to the ground wire protruding electrodes 28 that are formed on the protruding area 114. In the same manner, the signal lines 14 of the microstripline 10 are electrically connected to the signal line protruding electrodes 30 that are formed on the protruding area 114. It is preferable that electrical connections between the microstripline 10 and the protruding electrodes are achieved by using an ACF or a lead-free solder or the like that is provided on end portions of the protruding electrodes.

When a connection is made to the protruding area 114 of the TFT array substrate 111 using the microstripline 10 described above, as shown in FIGS. 8A and 8B, the plurality of ground wires 12 that are formed in a striped pattern are made to extend in a perpendicular direction relative to the side on the connecting side of the flexible substrate 123.

According to the present embodiment, when the flexible substrate 123 is connected to the TFT array substrate 111, it is possible to match the characteristic impedance that is caused by the condenser component and the inductor component of the signal line 14 and the like as far as the extended end portion of the ground wires 12 of the microstripline 10 on the active surface of the TFT array substrate 111. As a result, it is possible to suppress any degradation of the signal waveform, and it becomes possible to transmit a higher quality signal at a faster speed.

Note that the microstripline 10 of the present embodiment in which the ground wires 12 are formed in a striped configuration can also be applied to the above-described second and third embodiments.

Fifth Embodiment

This embodiment will now be described with reference made to the drawings.

Figure 9:
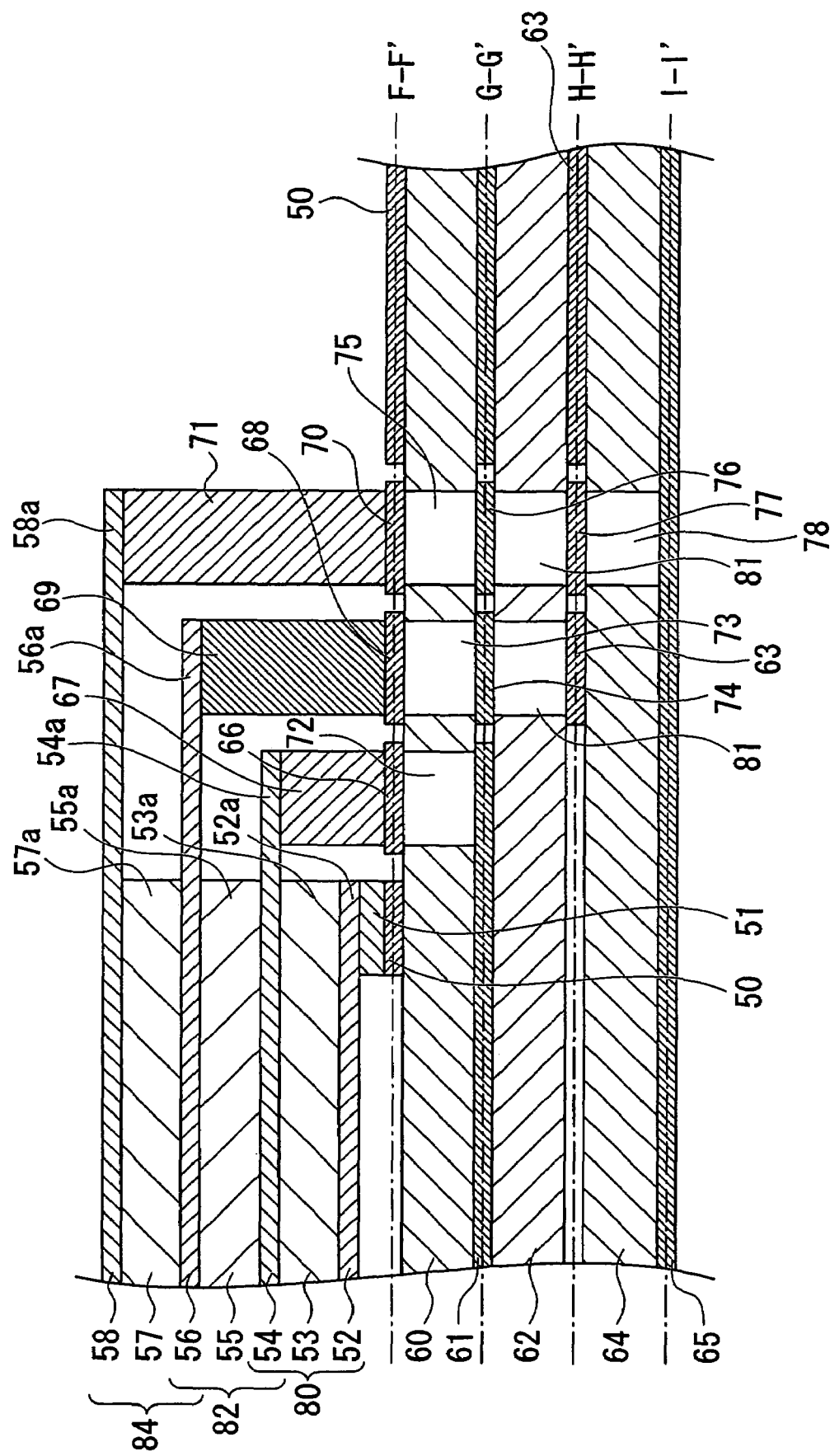
FIG. 9 is a cross-sectional view showing a connecting structure for connecting a plurality of microstriplines and TFT array substrates of the fifth embodiment.
Figure 10:
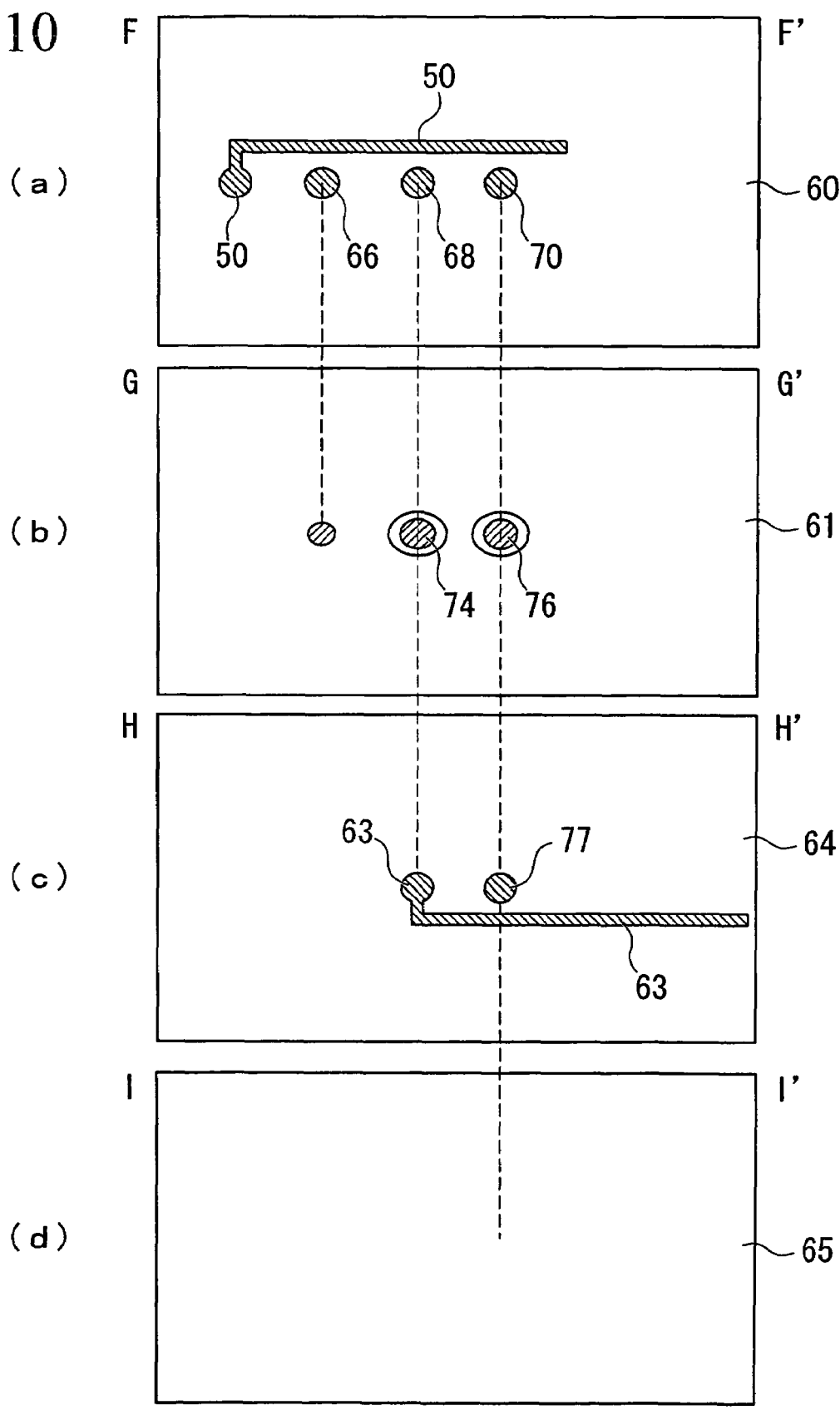
FIG. 10 is a view showing a cross-sectional structure of each layer of the connecting structure of the fifth embodiment.

FIG. 9 is a cross-sectional view showing the connecting structure between a multiple layers of microstriplines and flexible substrates. Moreover, parts (a) to (d) in FIG. 10 are cross-sectional views of the multilayer flexible substrate shown in FIG. 9. More specifically, the part (a) is a cross-sectional view taken along a line F-F' in FIG. 9, the part (b) is a cross-sectional view taken along a line G-G' in FIG. 9, the part (c) is a cross-sectional view taken along a line H-H' in FIG. 9, and the part (d) is a cross-sectional view taken along a line I-I' in FIG. 9. Note that, in the present embodiment, an example is described in which the microstripline is formed by three stacked layers, and the microstripline forming the first layer is referred to as the first microstripline 80, the microstripline forming the second layer is referred to as the second microstripline 82, and the microstripline forming the third layer is referred to as the third microstripline 84.

As shown in FIG. 9, ground wires 54 are formed on a top surface of an insulating layer 53 constituting the first microstripline 80, while signal lines 52 are formed on a bottom surface thereof. The ground wires 54 are formed so as to extend beyond an end portion 53a of the insulating layer and an end portion 52a of the signal lines.

The second microstripline 82 is stacked on top of the first microstripline 80. An insulating layer 55 of the second microstripline 82 is stacked such that an end portion 55a of the insulating layer is positioned on top of the end portion 53a of the insulating layer of the first microstripline 80. Signal lines 56 are formed on a top surface of the insulating layer 55, while the ground wires 54 are formed on a bottom surface thereof. The signal lines 56 are formed so as to extend beyond an end portion 54a of the signal lines and the end portion 55a of the insulating layer. Note that the same ground wires as those used for the ground wires 54 of the first microstripline 80 are used for the ground wires 54 of the second microstripline 82.

Furthermore, the third microstripline 84 is stacked on top of the second microstripline 82. An insulating layer 57 of the third microstripline 84 is stacked such that an end portion 57a of the insulating layer is positioned on top of the end portion 55a of the insulating layer of the second microstripline 82. Ground wires 58 are formed on a top surface of the insulating layer 57 of the third microstripline 84, while the signal lines 56 are formed on a bottom surface thereof. The ground wires 58 are formed so as to extend beyond an end portion 56a of the signal lines 56 and the end portion 57a of the insulating layer. Note that the same signal lines as those used for the signal lines 56 of the second microstripline 82 are used for the signal lines 56 of the third microstripline 84. Moreover, it is also possible to form the signal lines on the top surface of the insulating layer 57 of the third microstripline 84, and to form the ground wires on the bottom surface thereof. In this case, the third layer does not constitute a microstripline structure.

The microstriplines 80, 82, and 84 forming the first, second, and third layers are mounted on a flexible substrate that is formed by three layers, and are electrically connected to the wires of the respective flexible substrates. A description is given below of the cross-sectional structure of the flexible substrate. Note that the first layer of the flexible substrate that corresponds to the first microstripline 80 is referred to as the first flexible substrate 60, the second layer of the flexible substrate that corresponds to the second microstripline 82 is referred to as the second flexible substrate 62, and the third layer of the flexible substrate that corresponds to the third microstripline 84 is referred to as the third flexible substrate 64.

The signal lines 50 are connected to a top surface of the first flexible substrate 60 to which the first microstripline 80 is connected, while ground wires 61 are connected to a bottom surface thereof. As shown in the part (a) in FIG. 10, the signal lines 50 are formed so as to be connected to the end portion 52a of the signal lines of the first microstripline 80 so as not to make contact with other intermediate layers. Note that, in the present embodiment, end portions 50a of the signal lines 50 form circular signal line electrode terminals when seen in plan view. As shown in FIG. 9, signal line bumps 51 are formed on the signal lines 50 of the first flexible substrate 60. As a result, the signal lines 52 of the first microstripline 80 are electrically connected via the signal line bumps 51 to the signal lines 50 of the first flexible substrate 60.

As shown in the part (b) in FIG. 10, the ground wires 61 of the first flexible substrate 60 are solidly formed on a bottom surface of the flexible substrate 60. An intermediate layer 66 is formed at a position on a top surface of the flexible substrate 60 that corresponds to the end portion 54a of the ground wires of the first microstripline 80. As shown in FIGS. 9 and 10B, this intermediate layer 66 is formed in a circular shape when seen in plan view on the same layer, from the same material, and using the same process as the signal line 50. Ground wire bumps 67 that protrude to a greater height than the signal line bumps 51 are formed on the intermediate layer 66, and a via hole 72 that penetrates the flexible substrate 60 is formed in the layer below the intermediate layer 66. As a result, the ground wires 54 of the first microstripline 80 are electrically connected via the ground wire bumps 67, the intermediate layer 66, and the via hole 72 to the ground wires 61 of the flexible substrate 60.

The ground wires 61 are formed on a top surface of the second flexible substrate 62 to which the second microstripline 82 is connected, and signal lines 63 are formed on a bottom surface thereof. Note that the same ground wires as those used for the ground wires 61 of the first flexible substrate 60 are used for the ground wires 61 of the second flexible substrate 62.

As shown in the part (c) in FIG. 10, the signal lines 63 are formed so as to be connected to the end portion 56a of the signal lines of the second microstripline 82 so as not to make contact with other intermediate layers. Note that, in the present embodiment, end portions 63a of the signal lines form circular signal line electrode terminals when seen in plan view.

A first intermediate layer 68 is formed at a position on the flexible substrate 60 that corresponds to the end portion 56a of the signal lines of the second microstripline 82. As shown in FIGS. 9 and 10B, this first intermediate layer 68 is formed in a circular shape when seen in plan view on the same layer, from the same material, and using the same process as the signal line 50. Signal line bumps 69 that protrude to a greater height than the ground wire bumps 67 are formed on the first intermediate layer 68, and a first via hole 73 that penetrates the first flexible substrate 60 is formed in the layer below the first intermediate layer 70. Furthermore, as shown in FIG. 9, a second intermediate layer 74 is formed in the same layer as the ground wires 61 of the second flexible substrate 62, and a second via hole 81 that penetrates the second flexible substrate 62 is formed in a lower layer corresponding to the second intermediate layer 74. As shown in the part (b) in FIG. 10, the second intermediate layer 74 is formed in a circular shape when seen in plan view in a portion of the ground wires 61 that are solidly formed. A cavity portion that penetrates the ground wires 61 is formed in a toroidal shape at an outer circumference of the second intermediate layer 74, so that insulation is ensured between the second intermediate layer 74 and the ground wires 74. As a result, the signal lines 56 of the second microstripline 82 are electrically connected via the signal line bumps 69, the first intermediate layer 68, the first via hole 73, the second intermediate layer 74, and the second via hole 81 to the signal lines 63 of the second flexible substrate 62.

The signal lines 63 are formed on a top surface of the third flexible substrate 64 to which the third microstripline 84 is connected, and ground wires 65 are formed on a bottom surface thereof. Note that the same ground wires as those used for the ground wires 63 of the second flexible substrate 62 are used for the ground wires 63 of the third flexible substrate 62.

As shown in the part (d) in FIG. 10, the ground wires 65 of the third flexible substrate 64 are solidly formed on a bottom surface of the flexible substrate 64. A first intermediate layer 70 is formed at a position on the flexible substrate 60 that corresponds to the end portion 58a of the ground wires of the third microstripline 84. As shown in the part (a) in FIG. 10, this first intermediate layer 70 is formed in a circular shape when seen in plan view on the same layer, from the same material, and using the same process as the signal line 50. Ground wire bumps 71 that are formed at a greater height than the signal line bumps 69 are formed on the first intermediate layer 70, and a first via hole 75 that penetrates the first flexible substrate 60 is formed in the layer below the first intermediate layer 70. Furthermore, as shown in the part (b) in FIG. 10, a second intermediate layer 76 is formed in the same layer as the second ground wires, and a second via hole 83 that penetrates the second flexible substrate 62 is formed in a layer below the second intermediate layer 74. As shown in the part (b) in FIG. 10, the second intermediate layer 76 is formed in a circular shape when seen in plan view in a portion of the ground wires 61 that are solidly formed. A cavity portion that penetrates the ground wires 61 in a toroidal shape is formed at an outer circumference of the second intermediate layer 76, so that insulation is ensured between the second intermediate layer 76 and the ground wires 61. Furthermore, as shown in the part (c) in FIG. 10, a third intermediate layer 77 is formed in a circular shape when seen in plan view in the same layer as the signal lines 63 of the second flexible substrate 62 so as not to make contact with the signal lines 63, and a third via hole 78 that penetrates the third flexible substrate 64 is formed in a layer below the third intermediate layer 77. As a result, the ground wires 58 of the third microstripline 84 are electrically connected via the ground wire bumps 71, the first intermediate layer 70, the first via hole 75, the second intermediate layer 76, the second via hole 83, the third intermediate layer 77, and the third via hole 78 to the ground wires 65 of the third flexible substrate 64.

According to the present embodiment, by also extending each of the ground wires of the microstriplines when the microstriplines are stacked in multiple layers, it is possible to match the characteristic impedance that is caused by the condenser component and the inductor component of the signal lines and the like as far as the extended end portion of the ground wires of each microstripline. As a result, it is possible to suppress any degradation of the signal waveform, and it becomes possible to transmit a higher quality signal at a faster speed.

Sixth Embodiment

Figure 11:
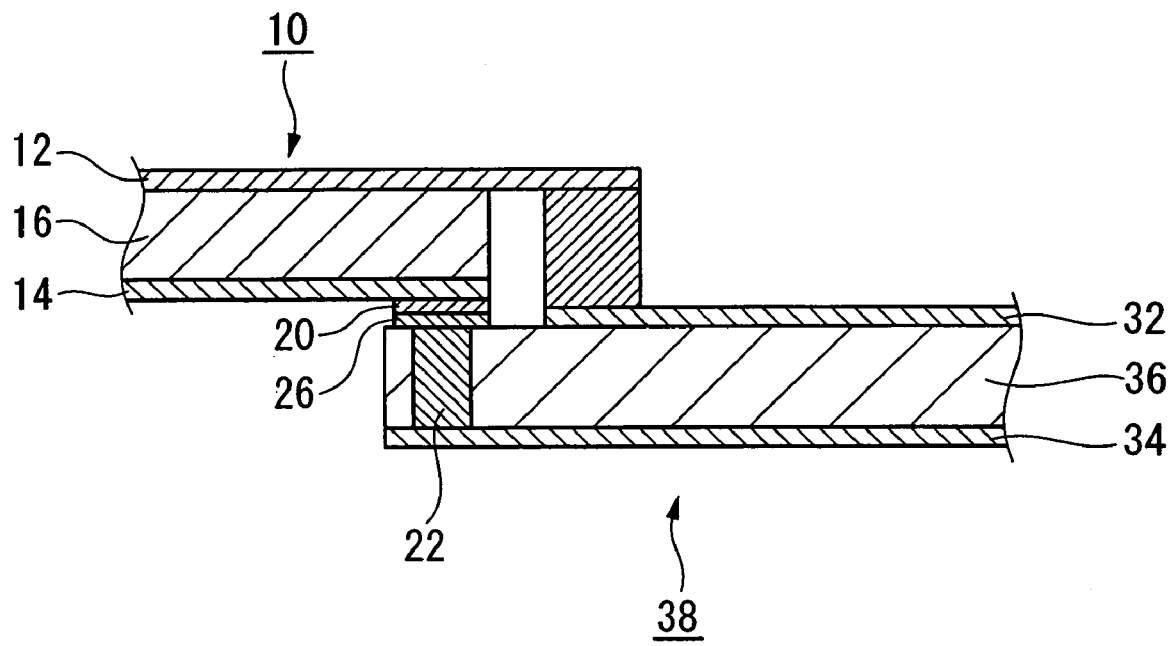
FIG. 11 is a cross-sectional view showing a connecting structure for connecting together microstriplines of the sixth embodiment.

FIG. 11 is a view showing the cross-sectional structure when the microstriplines 10 and 60 are connected together.

The upper side microstripline 10 is formed by a solidly formed insulating layer 16, signal lines 14 that are formed on a bottom surface of the insulating layer 16, and ground wires 12 that are formed on a top surface of the insulating layer 16. The signal lines 14 are formed so as to extend beyond the end portions 16a of the insulating layer and the end portions 14a of the signal lines.

The lower side microstripline 38 is formed by an insulating layer 36 that is solidly formed in the same manner as the above microstripline 10, ground wires 32 that are formed on a top surface of the insulating layer 36, and signal lines 34 that are formed on a bottom surface of the insulating layer 36. An intermediate layer 26 is formed at a position on the insulating layer 36 that corresponds to the end portion 14a of the signal lines of the microstripline 10. Signal line bumps 20 are formed on the intermediate layer 26, and a via hole 22 that penetrates the insulating layer 36 is formed in a bottom surface of the intermediate layer 26. As a result, the signal lines 14 of the microstripline 10 on the top side are electrically connected via the signal line bumps 20, the intermediate layer 26, and the via hole 22 to the signal lines 22 of the microstripline 10 on the bottom side.

The ground wires 32 of the microstripline 38 on the bottom side are connected to a position that corresponds to the end portion 12a of the ground wires of the microstripline 10. In addition, ground wires bumps 18 that protrude to a greater height than the signal line bumps 20 are formed on the ground wires 32. As a result, the ground wires 12 of the microstripline 10 on the top side are electrically connected via the ground wire bumps 18 to the ground wires 32 of the microstripline 38 on the bottom side.

As in the present embodiment, by also extending the ground wires 12 of the microstripline 10 when microstriplines are connected together, it is possible to match the characteristic impedance that is caused by the condenser component and the inductor component of the signal lines 14 as far as the extended end portion of the ground wires 12 of the microstripline 10. As a result, it is possible to suppress any degradation of the signal waveform, and it becomes possible to transmit a higher quality signal at a faster speed.

Variation of Sixth Embodiment

A variation of the present embodiment will now be described with reference made to the drawings.

Note that because the basic structure of the microstripline is the same as that of the above-described sixth embodiment, the same reference symbols are used for the same component elements and a detailed description thereof is omitted.

Figure 12:
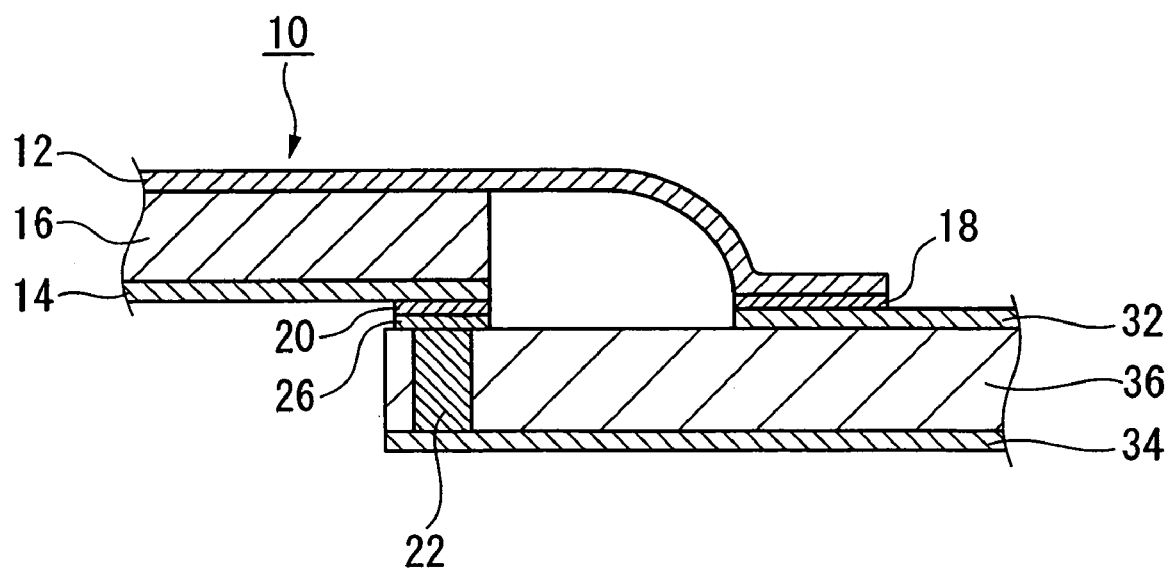
FIG. 12 is a cross-sectional view showing a connecting structure for connecting together microstriplines of a variation of the sixth embodiment.

FIG. 12 is a view showing the structure of a cross section when the microstriplines 10 and 38 are connected together.

In the present embodiment, the height of the ground wires bumps 18 that are formed on the ground wires 32 of the microstripline 38 on the bottom side is formed so as to be substantially equivalent to the height of the signal line bumps 20 that are formed on the intermediate layer 26. Because the height of the intermediate layer 26 is substantially equivalent to the height of the ground wires 32 that are formed on the same layer, the height obtained by adding the height of the intermediate layer 26 to the height of the ground wire bumps 18 is substantially the same as the height obtained by adding the height of the ground wires 34 to the height of the signal line bumps 20. Moreover, because the ground wire bumps 18 and the signal line bumps 20 are formed at substantially the same height, they are formed simultaneously using a normal substrate formation process. Note that, instead of the ground wire bumps 18 and the signal line bumps 20, it is also possible to use a solder paste.

In the present embodiment, unlike in the above embodiments, the height of the top surface of the ground wires 32 is lower than the height of the top surface of the microstripline 10. Because of this, when the ground wires 12 of the microstripline 10 are being connected to the ground wires 32 of the microstripline 38, as shown in FIG. 12, the ground wires 12 of the microstripline 10 are bent in a vertical direction. As a result, the ground wires 12 and the ground wire bumps 18 are electrically connected.

According to the present embodiment, even when the ground wires 12 of the microstripline 10 are bent and extended, it is still possible to match the characteristic impedance that is caused by the condenser component and the inductor component of the signal lines 14 as far as the extended end portion of the ground wires 12 of the microstripline 10. As a result, it is possible to suppress any degradation of the signal waveform, and it becomes possible to transmit a higher quality signal at a faster speed.

Note that, in the present embodiment, an example is described in which the microstriplines 10 and 38 are connected together, however, the present invention can also be applied when the above-described flexible substrate is used for one of the microstriplines 10 and 38.

Electronic Apparatus

Figure 13:
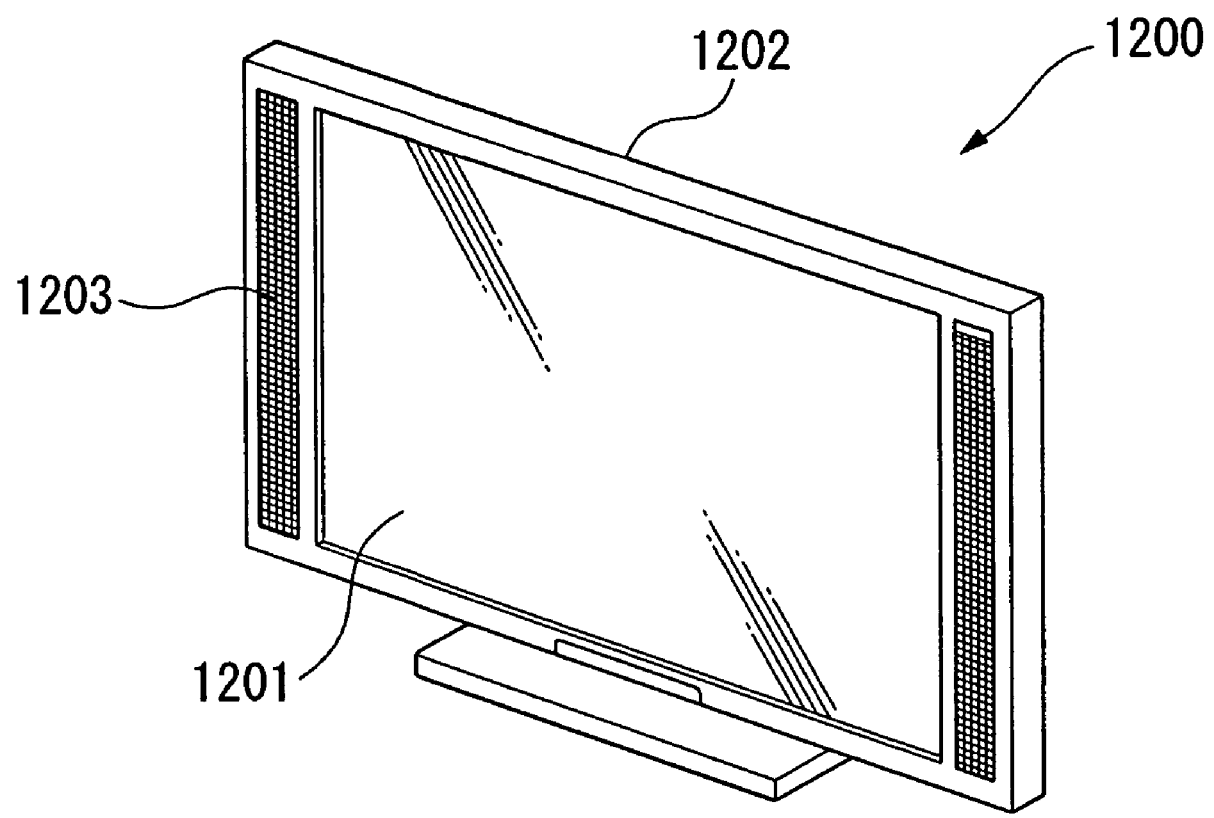
FIG. 13 is a perspective view showing an example of an electronic apparatus of the present invention.

Next, a description is given of a liquid crystal display device that is an example of an electronic apparatus in which a flexible substrate 123 and a TFT array substrate 111 are connected using a microstripline 10 having the above-described structure. FIG. 13 is a perspective view showing in typical form a liquid crystal display device. The above-described microstripline 10 is used inside a housing of a liquid crystal display device 1200. In FIG. 13, the reference symbol 1201 indicates a display section, the reference symbol 1202 indicates a liquid crystal display device body, and the reference symbol 1203 indicates a speaker. By using the above-described microstripline 10, it is possible to transmit a high quality signal at a faster speed, and it is possible to provide a liquid crystal display device that has an excellent display quality.

Note that the microstripline 10 having the above-described structure can be used in a variety of electronic apparatuses in addition to a liquid crystal display device. For example, this microstripline 10 can also be used in electronic apparatuses such as liquid crystal projectors, personal computers (PC) and engineering work station (EWS) for dealing with multimedia, pagers, word processors, viewfinder or monitor direct view types of video tape recorders, electronic notebooks, electronic desktop calculators, car navigation systems, POS terminals, and apparatuses that are provided with touch panels.

Note that the technological range of the present invention is not limited to the above-described embodiments. Various modifications may be added to the above-described embodiments insofar as they do not depart from the spirit of the present invention.

For example, in the above-described first and second embodiments, the ground wires 12 of the microstripline 10 are formed so as to extend from the end portions of the insulating layer 16 and the signal lines 14. In contrast to this, it is preferable for the signal lines 14 to be formed so as to extend from the end portions of the insulating layer 16 and the ground wires 12. According to this type of structure, it is possible to achieve a matching of the impedance as far as the end portion of the ground wires 12.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A connecting structure comprising:
a first substrate having a third surface and a fourth surface, the third surface being opposite of the fourth surface;
a second substrate which is formed of a flexible material, and has a first surface and a second surface, the first surface being opposite of the second surface, and the second substrate being parallel to the first substrate such that the first surface faces the fourth surface;
a first conductive member that is formed on the first surface, the first conductive member being thinner than a thickness of the second substrate;
a second conductive member that is formed on the second surface so as to extend beyond an end portion of the first conductive member, the second conductive member being thinner than a thickness of the second substrate;
a first convex portion that is provided on the fourth surface or the first conductive member; and
a second convex portion that is provided on the fourth surface or the second conductive member, wherein:
the first convex portion is connected to the first conductive member;
the second convex portion is connected to the second conductive member;
the first convex portion and the second convex portion originate on the same plane; and
the height of the second convex portion is greater than the height of the first convex portion.

2. The connecting structure according to claim 1, wherein a plurality of the connecting substrates are stacked on the first substrate.

3. An electro-optical device comprising the connecting structure according to claim 1.

4. An electronic apparatus comprising the electro-optical device according to claim 3.

5. A connecting structure comprising:
a first substrate having a third surface and a fourth surface, the third surface being opposite of the fourth surface;
a second substrate which is formed of a flexible material, and has a first surface and a second surface, the first surface being opposite of the second surface, and the second substrate being parallel to the first substrate such that the first surface faces the fourth surface;
a first conductive member that is formed on the first surface, the first conductive member being thinner than a thickness of the second substrate;
a second conductive member that is formed on the second surface so as to extend beyond an end portion of the first conductive member, the second conductive member being thinner than a thickness of the second substrate;
a first convex portion that is provided on the fourth surface or the first conductive member; and
a second convex portion that is provided on the fourth surface or the second conductive member, wherein:
the first convex portion is connected to the first conductive member;
the second convex portion is connected to the second conductive member;

the first convex portion and the second convex portion originate on the same plane; and the height of the first convex portion and the height of the second convex portion are substantially equal.

6. A connecting structure comprising:

a first substrate having a third surface and a fourth surface, the third surface being opposite of the fourth surface;

a second substrate which is formed of a flexible material, and has a first surface and a second surface, the first surface being opposite of the second surface, and the second substrate being parallel to the first substrate such that the first surface faces the fourth surface;

a first conductive member that is formed on the first surface so as to be shorter than an end portion of the second substrate, the first conductive member being thinner than a thickness of the second substrate;

a second conductive member that is formed on the second surface, the second conductive member being thinner than the thickness of the second substrate;

a third conductive member that is provided on the third surface so as to extend beyond an end portion of the first substrate;

a fourth conductive member that is provided on the fourth surface;

a first convex portion that is provided so as to connect electrically the first conductive member and the third conductive member; and a second convex portion that is provided so as to connect electrically the second conductive member and the fourth conductive member via a conductive material that fills a penetration hole formed in the second substrate so as to extend in the thickness direction of the second substrate.

7. A connecting structure comprising:

a first substrate having a third surface and a fourth surface, the third surface being opposite of the fourth surface;

a second substrate which is formed of a flexible material, and has a first surface and a second surface, the first surface being opposite of the second surface, and the second substrate being parallel to the first substrate such that the first surface faces the fourth surface;

a first conductive member that is formed on the first surface, the first conductive member being thinner than a thickness of the second substrate;

a second conductive member that is formed on the second surface so as to extend beyond an end portion of the second substrate, the second conductive member being thinner than the thickness of the second substrate;

a third conductive member that is provided on the fourth surface so as to be shorter than an end portion of the first substrate;

a fourth conductive member that is provided on the third surface;

a first convex portion that electrically connects the first conductive member and the fourth conductive member via a conductive material that fills a penetration hole formed in the second substrate so as to extend in the thickness direction of the first substrate; and a second convex portion that electrically connects the second conductive member and the third conductive member.

8. The connecting structure according to claim 7, wherein a plurality of the connecting substrates are stacked on the first substrate.

9. An electro-optical device comprising the connecting structure according to claim 7.

10. An electronic apparatus comprising the electro-optical device according to claim 9.

11. A connection method comprising:

providing a first substrate having a third surface and a fourth surface, the third surface being opposite of the fourth surface;

providing a second substrate which is formed of a flexible material, and has a first surface and a second surface, the first surface being opposite of the second surface, and the second substrate being parallel to the first substrate such that the first surface faces the fourth surface;

forming a first conductive member on the first surface, the first conductive member being thinner than a thickness of the second substrate;

forming a second conductive member on the second surface so as to extend beyond an end portion of the first conductive member and an end portion of the second substrate, the second conductive member being thinner than the thickness of the second substrate;

providing a first convex portion on the fourth surface or the first conductive member, providing a second convex portion on the fourth surface or the second conductive member; and connecting the first conductive member and the first convex portion together and connecting the second conductive member and the second convex portion together, wherein the first convex portion and the second convex portion originate on the same plane; and the height of the second convex portion is greater than the height of the first convex portion.

* * * * *